US007303857B2

(12) United States Patent
Goto

(10) Patent No.: US 7,303,857 B2
(45) **Date of Patent: *Dec. 4, 2007**

(54) PHOTOSENSITIVE COMPOSITION AND PLANOGRAPHIC PRINTING PLATE PRECURSOR

(75) Inventor: Takahiro Goto, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 139 days.

This patent is subject to a terminal disclaimer.

(21) Appl. No.: 10/948,470

(22) Filed: Sep. 24, 2004

(65) Prior Publication Data

US 2005/0064332 A1 Mar. 24, 2005

(30) Foreign Application Priority Data

Sep. 24, 2003 (JP) ............................ 2003-331525

(51) Int. Cl.
*G03F 7/031* (2006.01)
*G03F 7/033* (2006.01)

(52) U.S. Cl. .............................. 430/281.1; 430/287.1; 430/288.1; 430/302

(58) Field of Classification Search ............ 430/281.1, 430/287.1, 288.1, 270.1, 302
See application file for complete search history.

(56) References Cited

U.S. PATENT DOCUMENTS

| | | | | |
|---|---|---|---|---|
| 3,725,356 | A | 4/1973 | Lüders et al. | |
| 3,804,631 | A | 4/1974 | Faust | |
| 3,839,171 | A | 10/1974 | Akamatsu et al. | |
| 3,930,865 | A | 1/1976 | Faust et al. | |
| 4,019,972 | A | 4/1977 | Faust | |
| 4,239,849 | A | 12/1980 | Lipson et al. | |
| 4,476,215 | A | 10/1984 | Kausch | |
| 4,499,163 | A | 2/1985 | Ishimaru et al. | |
| 4,510,227 | A | 4/1985 | Mohr et al. | |
| 4,537,855 | A | 8/1985 | Ide | |
| 4,687,727 | A | 8/1987 | Toyama et al. | |
| 4,772,538 | A | 9/1988 | Walls et al. | |
| 4,950,581 | A | 8/1990 | Koike et al. | |
| 4,952,478 | A | 8/1990 | Miyagawa et al. | |
| 5,080,999 | A | 1/1992 | Imai et al. | |
| 5,200,292 | A | 4/1993 | Shinozaki et al. | |
| 5,246,816 | A | 9/1993 | Yamasita et al. | |
| 5,340,699 | A | 8/1994 | Haley et al. | |
| 5,641,608 | A | 6/1997 | Grunwald et al. | |
| 5,705,322 | A | 1/1998 | West et al. | |
| 5,879,861 | A | 3/1999 | Van Damme et al. | |
| 5,919,601 | A | 7/1999 | Nguyen et al. | |
| 5,952,154 | A | 9/1999 | Barr et al. | |
| 5,965,319 | A | 10/1999 | Kobayashi | |
| 5,985,526 | A | 11/1999 | Tutt et al. | |
| 6,013,412 | A | 1/2000 | Aoshima | |
| 6,030,750 | A | 2/2000 | Vermeersch et al. | |
| 6,165,685 | A | 12/2000 | Maerz et al. | |
| 6,309,792 | B1 | 10/2001 | Hauck et al. | |
| 6,399,689 | B1 | 6/2002 | Scarlette | |
| 6,423,462 | B1 | 7/2002 | Kunita | |
| 6,482,571 | B1 | 11/2002 | Teng | |
| 6,566,035 | B1 | 5/2003 | Aoshima | |
| 6,569,603 | B2 * | 5/2003 | Furukawa | 430/287.1 |
| 6,576,401 | B2 | 6/2003 | Teng | |
| 6,692,896 | B2 * | 2/2004 | Shimada et al. | 430/281.1 |
| 6,716,566 | B2 * | 4/2004 | Aoshima | 430/273.1 |
| 6,733,948 | B2 | 5/2004 | Nakamura et al. | |
| 6,794,116 | B2 | 9/2004 | Oshima | |
| 6,838,222 | B2 | 1/2005 | Aoshima et al. | |
| 6,861,200 | B2 | 3/2005 | Oshima | |
| 6,933,093 | B1 * | 8/2005 | Arias et al. | 430/270.1 |
| 2001/0036598 | A1 | 11/2001 | Shimada et al. | |
| 2002/0051934 | A1 | 5/2002 | Nakamura et al. | |
| 2002/0055058 | A1 | 5/2002 | Sorori et al. | |
| 2002/0160295 | A1 | 10/2002 | Aoshima et al. | |
| 2002/0177074 | A1 | 11/2002 | Hoshi et al. | |
| 2002/0197564 | A1 | 12/2002 | Timpe et al. | |
| 2003/0008239 | A1 | 1/2003 | Fujimaki et al. | |
| 2003/0068575 | A1 | 4/2003 | Yanaka | |
| 2003/0073032 | A1 | 4/2003 | Aoshima | |
| 2003/0082478 | A1 | 5/2003 | Itakura et al. | |
| 2003/0162127 | A1 | 8/2003 | Kikuchi | |
| 2003/0186174 | A1 | 10/2003 | Nagase | |
| 2004/0063034 | A1 | 4/2004 | Goto | |
| 2004/0072101 | A1 | 4/2004 | Sugasaki et al. | |
| 2004/0131971 | A1 | 7/2004 | Sugasaki et al. | |

(Continued)

FOREIGN PATENT DOCUMENTS

| | | |
|---|---|---|
| CA | 1338095 | 2/1996 |

(Continued)

OTHER PUBLICATIONS

McGinniss, Vincent D., "Radiation Curing: 6. Curing with Ultraviolet, Visible and Infrared Processing Equipment" from Kirk-Othmer Encyclopedia of Chemical Technology, copyright 1996, by John Wiley & Sons, Inc., Aricle Online posting date Dec. 4, 2000.

(Continued)

*Primary Examiner*—John S. Chu
(74) *Attorney, Agent, or Firm*—Sughrue Mion Pllc.

(57) ABSTRACT

The present invention provides a photosensitive composition including a compound that generates a radical by application of light or heat, a polymer having a phenyl group substituted with a vinyl group on the side chain, a monomer having two or more phenyl groups substituted with a vinyl group, an infrared absorbing agent, and a compound having at least one carboxylic acid group and a weight average molecular weight of 3,000 or less. Additionally, the invention provides a planographic printing plate precursor including a substrate and a negative recording layer provided on the substrate and containing the above photosensitive composition.

18 Claims, 1 Drawing Sheet

U.S. PATENT DOCUMENTS

| | | | | |
|---|---|---|---|---|
| 2004/0137369 | A1 | 7/2004 | Shimada | |
| 2004/0157153 | A1 | 8/2004 | Takamuki | |
| 2004/0170920 | A1* | 9/2004 | Goto | 430/271.1 |
| 2004/0170922 | A1 | 9/2004 | Goto | |
| 2004/0175648 | A1* | 9/2004 | Goto | 430/270.1 |
| 2004/0202957 | A1 | 10/2004 | Murota | |
| 2004/0223042 | A1 | 11/2004 | Goto | |
| 2004/0244619 | A1 | 12/2004 | Goto | |
| 2005/0026082 | A1 | 2/2005 | Shimada | |
| 2005/0037282 | A1 | 2/2005 | Sonokawa | |
| 2005/0100821 | A1* | 5/2005 | Goto | 430/280.1 |

FOREIGN PATENT DOCUMENTS

| | | | |
|---|---|---|---|
| EP | 0 377 321 | A2 | 7/1990 |
| EP | 0 684 522 | A1 | 11/1995 |
| EP | 0 779 161 | A1 | 6/1997 |
| EP | 0 919 870 | A1 | 6/1999 |
| EP | 0 950 517 | A1 | 10/1999 |
| EP | 0 950 518 | A1 | 10/1999 |
| EP | 1 033 624 | A1 | 9/2000 |
| EP | 1 096 315 | A1 | 5/2001 |
| EP | 1 110 747 | A1 | 6/2001 |
| EP | 1 160 095 | A2 | 12/2001 |
| EP | 1 176 467 | A1 | 1/2002 |
| EP | 1 182 033 | A1 | 2/2002 |
| EP | 1 186 407 | A1 | 3/2002 |
| EP | 1 216 830 | A2 | 6/2002 |
| EP | 1 219 464 | A2 | 7/2002 |
| EP | 1 235 107 | A1 | 8/2002 |
| EP | 1 241 002 | A2 | 9/2002 |
| EP | 1 245 405 | A2 | 10/2002 |
| EP | 1 249 731 | A2 | 10/2002 |
| EP | 1 332 870 | A2 | 8/2003 |
| EP | 1 338 921 | A2 | 8/2003 |
| EP | 1 341 040 | A1 | 9/2003 |
| EP | 1 369 231 | A2 | 12/2003 |
| EP | 1 249 343 | A3 | 1/2004 |
| EP | 1 400 851 | A2 | 3/2004 |
| EP | 1 449 650 | A2 | 8/2004 |
| GB | 1 521 372 | | 8/1978 |
| JP | 54-92723 | A | 7/1979 |
| JP | 54-25957 | B2 | 8/1979 |
| JP | 54-34327 | B2 | 10/1979 |
| JP | 58-29803 | A | 2/1983 |
| JP | 58-12577 | B2 | 3/1983 |
| JP | 58-134629 | A | 8/1983 |
| JP | 59-44615 | A | 3/1984 |
| JP | 59-71048 | A | 4/1984 |
| JP | 2-161442 | A | 6/1990 |
| JP | 4-31863 | A | 2/1992 |
| JP | 4-106548 | A | 4/1992 |
| JP | 7-20629 | A | 1/1995 |
| JP | 7-60268 | A | 6/1995 |
| JP | 7-271029 | A | 10/1995 |
| JP | 8-108621 | A | 4/1996 |
| JP | 08-137096 | | 5/1996 |
| JP | 08-248639 | | 9/1996 |
| JP | 9-43847 | A | 2/1997 |
| JP | 2712564 | B2 | 10/1997 |
| JP | 10-195119 | A | 7/1998 |
| JP | 11-212252 | A | 8/1999 |
| JP | 11-231535 | A | 8/1999 |
| JP | 11-258801 | A | 9/1999 |
| JP | 2000-131837 | A | 5/2000 |
| JP | 2000-267265 | A | 9/2000 |
| JP | 2001-133969 | A | 5/2001 |
| JP | 2001-290271 | A | 10/2001 |
| JP | 2002-40652 | A | 2/2002 |
| JP | 2002-72462 | | 3/2002 |
| JP | 2002-278081 | A | 9/2002 |
| JP | 2003-29408 | A | 1/2003 |
| JP | 2003-043687 | A | 2/2003 |
| WO | WO 00/48836 | A1 | 8/2000 |

OTHER PUBLICATIONS

SR-295, product bulletin, SARTOMER Company, Exton, PA, one page, dated Nov. 1998 from internet through Sartomer web site.
SR-399, Product bulletin, SARTOMER Company, Exton, PA, one page, dated Nov. 1998, from internet through Sartomer web site.
SR-492, product bulletin, SARTOMER Company, Exton, PA one page, dated Nov. 1998 from internet through Sartomer web site.
CD-501, product bulletin, SARTOMER Company, Exton, PA, one page, dated May 1999 from internet through Sartomer web site.
SR-368, product bulletin, SARTOMER Company, Exton, PA, 1 page, dated Nov. 1998, from internet through Sartomer web site.
Product Data, Scripset 550 Styrene Maleic Anhydride Copolymer Solid, Hercules Incorporated, copyright 1999, dated Jun. 2000 from internet.
European Search Report dated Jul. 2, 2002.
European Search Report dated Apr. 16, 2004.
European Search Report dated Jan. 16, 2004.
European Search Report dated Jun. 14, 2005.
Jerry March: "Advanced organic chemistry: reactions, mechanisms, and structure" 1992, Wiley-Interscience, 4th Ed., USA, XP 002275533 p. 280, Table 9.4.
Ben-zyl from The American Heritage dictionary of the English Language, Fourth Edition, copyright 2000 by Houghton Mifflin Company found at yourdictionary.com, one page.
Mineo et al, 08062834, English Abstract of Japanese Published Application 08062834 dated Mar. 8, 1996, pg. Patent Abstracts of Japan dated 1996.
Office Action dated Jan. 31, 2005 from U.S. Appl. No. 10/673,332.
Office Action dated Jan. 25, 2005 from U.S. Appl. No. 10/673,332.
Office Action dated Apr. 18, 2005 from U.S. Appl. No. 10/781,922.
Office Action dated Mar. 9, 2005 from U.S. Appl. No. 10/671,776.
Office Action dated Feb. 23, 2005 from U.S. Appl. No. 10/669,696.
Office Action dated Mar. 21, 2005 from U.S. Appl. No. 10/779,788.
Office Action dated Apr. 18, 2005 from U.S. Appl. No. 10/781,645.
Office Action dated Sep. 7, 2005 from U.S. Appl. No. 10/779,788.
Office Action dated Feb. 24, 2006 from U.S. Appl. No. 10/779,788.
Registry No. 2154-56-5, one page, "benzyl", no date.
Patent Abstracts of Japan for Publication No. 0806283, Published Mar. 8, 1994.
Patent Abstracts of Japan for Publication No. 59-053836, Published Mar. 28, 1984, Applicant: Fuji Photo Film Co., Ltd.

* cited by examiner

PHOTOSENSITIVE COMPOSITION AND PLANOGRAPHIC PRINTING PLATE PRECURSOR

CROSS-REFERENCE TO RELATED APPLICATION

This application claims priority under 35 USC 119 from Japanese Patent Application No. 2003-331525, the disclosures of which is incorporated by reference herein.

BACKGROUND OF THE INVENTION

1. Field of the Invention

The present invention relates to a photosensitive composition and a planographic printing plate precursor, in particular, to an infrared laser-compatible photosensitive composition suitable for use in so-called the direct-type planographic printing plate precursors, which allow direct plate-making from digital signals from computer and the like, and a planographic printing plate precursor employing the photosensitive composition.

2. Description of the Related Art

In the recent rapid progress in laser technology, smaller and higher-performance solid state and semiconductor lasers having an emission wavelength in the range from the near-infrared to infrared region are becoming readily accessible. For that reason, these lasers are very useful as the exposure-light sources for direct plate-making employing the digital data from computers and the like.

Infrared laser-compatible negative planographic printing plate precursors that utilize infrared lasers having an emission wavelength in the infrared region as the exposure-light source have a negative recording layer made of a photosensitive composition containing an infrared absorbing agent, radical generator, and polymerizable compound. Image portions on the negative recording layer are formed by the recording method wherein the exposed portions of recording layer are hardened by polymerization triggered by the radicals generated by light or heat as the initiator. Alternatively, when the infrared absorbing agent is a dye, the image portions are formed by the recording method wherein the exposed portions of recording layer are hardened by polymerization triggered by the radicals generated by electron transfer from the infrared ray-absorbed dye as the initiator.

In addition, photosensitive compositions and planographic printing plates employing a combination of a resol resin, novolak resin, infrared absorbing agent, and photochemical acid generator are disclosed in Japanese Patent Application Laid-Open (JP-A) Nos. 7-20629 and 7-271029, while planographic printing plates employing a combination of a particular polymer, photochemical acid generator, and near-infrared sensitizing dye are disclosed in JP-A Nos. 11-212252 and 11-231535. Hardened portions (image portions) on these photosensitive compositions and planographic printing plates disclosed are formed by the mechanism that the curing reaction is triggered by the acids generated by a photochemical acid generator as the initiator.

However, it is difficult to provide such photosensitive compositions wherein the curing reaction for image formation is triggered by the photopolymerization initiator or photochemical acid generator described above with sufficiently high photosensitivity in the near-infrared region. The photosensitivity is insufficient for applying these compositions to scanning exposure using infrared laser beam.

The curing reaction employing a photopolymerization initiator or photochemical acid generator often does not proceed satisfactorily only by exposure. Accordingly, when such a polymerizable composition is applied onto a planographic printing plate precursor, a heating treatment was indispensable for plate-making, as it is required after exposure or development for accelerating and completing the curing reaction. However, the heating treatment not only lowers the production efficiency but also contains a factor that may lead to deterioration in quality. For example, it is difficult to keep the difference in solubility between the exposed and unexposed portions on a certain level, and thus the exposed portions are also dissolved in the developing solution when the heating is insufficient, while the unexposed portions are partially insolubilized, impairing development, when the heating temperature is too high.

To overcome these problems, photosensitive compositions and planographic printing plate materials that have sufficiently high i.e., superior photosensitivity in the near-infrared region and do not require a heating treatment or an overcoat layer and allows image formation by scanning exposure are disclosed for example, in JP-A Nos. 2001-290271, 2002-278081, 2003-29408, and, 2003-43687. However, these planographic printing plate materials are still inadequate in developability and stability over time.

SUMMARY OF THE INVENTION

The present invention aims to overcome the problems above and achieve the following object.

Namely, an object of the invention is to provide a photosensitive composition and a planographic printing plate precursor superior in photosensitivity to infrared light and also in developability and stability over time.

The object of the invention has been accomplished by the following photosensitive composition and a planographic printing plate precursor employing the photosensitive composition.

A first aspect of the present invention is to provide a photosensitive composition, comprising a compound that generates a radical by application of light or heat (radical generator), a polymer having a phenyl group substituted with a vinyl group on the side chain (binder polymer), a monomer having two or more phenyl groups substituted with a vinyl group (polymerizable compound), an infrared absorbing agent, and a compound having at least one carboxylic acid group and a weight average molecular weight of 3,000 or less (carboxylic acid compound).

A second aspect of the present invention is to provide a planographic printing plate precursor comprising a substrate and a negative recording layer provided on the substrate, wherein the recording layer contains a photosensitive composition of the present invention.

The action mechanism of the invention is not clearly understood but seems to be the followings.

In the invention, as the carboxylic acid compound is superior in alkali-solubility and does not show change in alkali-solubility over time, allowing improvement in the stability of photosensitive composition over time (raw stock storability). Further, planographic printing plate precursor employing the photosensitive composition containing, in addition to the carboxylic acid compound, a radical generator, a binder polymer, a polymerizable compound and each component of an infrared absorbing agent as the negative recording layer, allows good effect in high-sensitivity recording, suppression of undissolved film remaining in non-image portions, and the printing durability of image portions, even after storage for an extended period of time as they are unexposed.

The invention provides a photosensitive composition and a planographic printing plate precursor superior in photosensitivity to infrared light and also in developability and stability over time.

DETAILED DESCRIPTION OF THE INVENTION

Figure 1:
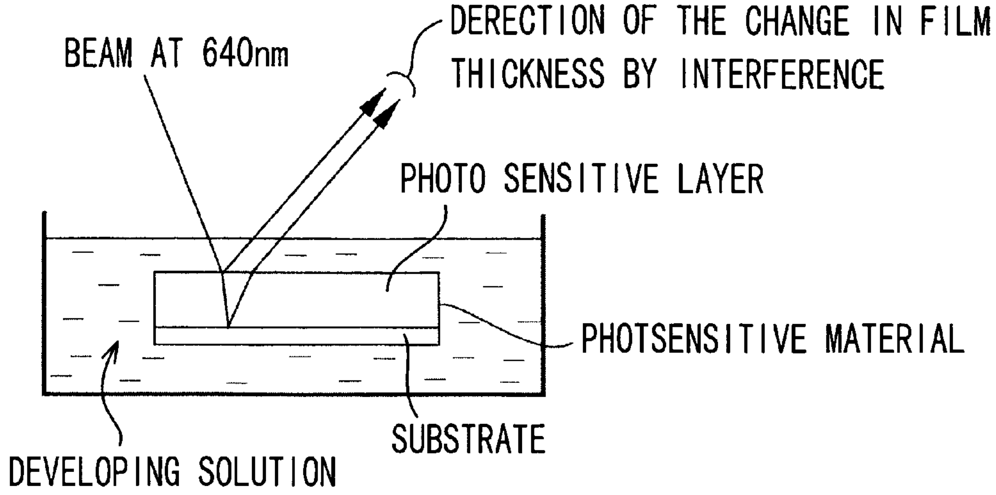
FIG. 1 is a schematic diagram illustrating an example of the DRM interference wave-measuring instrument used for determining the dissolving behavior of a negative recording layer.

Hereinafter, the present invention will be described in detail.

<Photosensitive Composition>

The photosensitive composition according to the invention comprises a compound that generates a radical by application of light or heat, a polymer having a phenyl group substituted with a vinyl group on the side chain, a monomer having two or more phenyl groups substituted with a vinyl group, an infrared absorbing agent, and a compound having at least one carboxylic acid group and a weight average molecular weight of 3,000 or less.

Hereinafter, each of the components contained in the photosensitive composition will be described separately.

[Compound having at Least One Carboxylic Acid Group and a Weight Average Molecular Weight of 3,000 or Less]

The compound having at least one carboxylic acid group and a weight average molecular weight of 3,000 or less according to the invention (hereinafter, referred to as "particular carboxylic acid compound") may be selected suitably from compounds including, for example, aliphatic carboxylic acids which may have one or more substituents, aromatic carboxylic acids which may have one or more substituents, carboxylic acids connected directly to a heterocyclic ring which may have one or more substituents, and the like. Among these compounds, phthalic acid derivatives, trimellitic acid derivatives, pyromellitic acid derivatives, succinic acid derivatives, benzoic acid derivatives, glycine derivatives and the like are preferable.

In the invention, the particular carboxylic acid compound must have a weight average molecular weight of 3,000 or less. The weight average molecular weight of the particular carboxylic acid compound is preferably in the rage of 60 to 2,000 and more preferably in the range of 100 to 1,500. It is unfavorable that the weight average molecular weight is too high, because the particular carboxylic acid compound may be absorbed on the substrate, when a photosensitive composition containing the particular carboxylic acid compound is applied to a planographic printing plate precursor.

Specific examples of the particular carboxylic acid compounds preferably used in the invention are shown below (compound Nos. 1 to 20). However, the invention is not restricted to these examples.

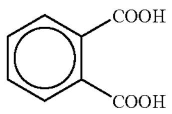
1

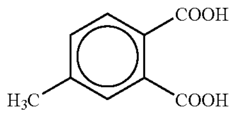
2

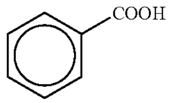
3

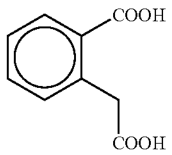
4

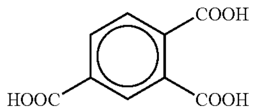
5

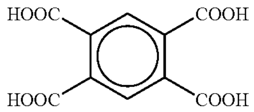
6

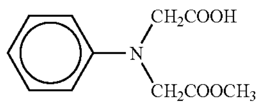
7

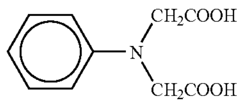
8

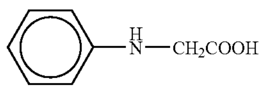
9

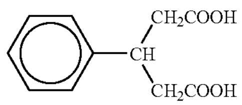
10

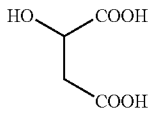
11

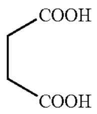
12

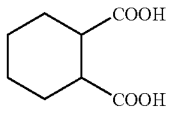
13

-continued

14

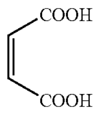

15

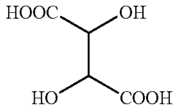

16

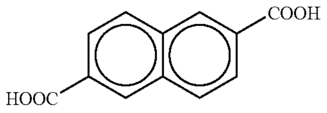

17

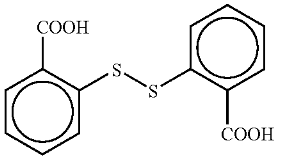

18

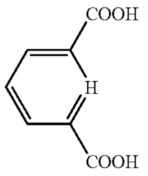

19

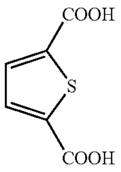

20

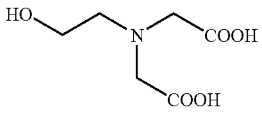

The content of the particular carboxylic acid compound in the photosensitive composition is preferably 0.5% to 30% and more preferably 2% to 20% by mass with respect to the total solid content contained in the photosensitive composition.

The particular carboxylic acid compounds may be used alone or in combination of two or more.

[Compound that Generates a Radical by Application of Light or Heat (Radical Generator)]

Any compound that generates a radical by application of light or heat may be used as the compound that generates a radical by application of light or heat according to the invention (hereinafter, referred to as "radical generator").

Examples of the radical generators include organic boron salts, trihaloalkyl-substituted compounds (e.g., trihaloalkyl-substituted nitrogen-containing heterocyclic compounds including, for example, s-triazine compounds, oxadiazole derivatives, trihaloalkylsulfonyl compounds and the like), hexaarylbisimidazoles, titanocene compounds, ketoxime compounds, thio compounds, organic peroxide, and the like.

In particular, among these radical generators, organic boron salts and trihaloalkyl-substituted compounds are preferable for the invention. Combined use of an organic boron salt and a trihaloalkyl-substituted compound is more preferable.

Organic boron anion in the organic boron salts is represented by the following Formula (1).

Formula (1)

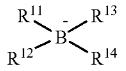

In Formula (1), $R^{11}$, $R^{12}$, $R^{13}$ and $R^{14}$ each represent an alkyl group, an aryl group, an aralkyl group, an alkenyl group, group an alkynyl group, or a cycloalkyl group, or a heterocyclic group. $R^{11}$, $R^{12}$, $R^{13}$ and $R^{14}$ may be the same or different from each other. A case where one of $R^{11}$, $R^{12}$, $R^{13}$ and $R^{14}$ is an alkyl group and others are aryl groups is particularly preferable.

The organic boron anion is present together with a cation, forming salts therewith. Examples of the cation include alkali metal ions, onium ions, and cationic sensitizing dyes.

Examples of the onium ion further include ammonium, sulfonium, iodonium, and phosphonium ions.

If the organic boron salt is formed from an organic boron anion and an alkali metal or onium ion, it is commonly practiced to add a sensitizing dye (i.e., infrared absorbing agent in the invention) separately for increasing the photosensitivity in the wavelength range of the light the dye absorbs. Alternatively, if the organic boron salt used is a cationic sensitizing dye having an organic boron anion as the counter anion, the resulting composition has an increased photosensitivity in the range of the absorption wavelength of the cationic sensitizing dye. However in the latter case, it is preferable to use the salt of an alkali metal ion or onium ion and an organic boron anion together with the organic boron salt.

Salts containing the organic boron anion represented by the Formula (1) above are preferable as the organic boron salt according to the invention. Cations preferably used for salt formation are alkali metal ions and onium ions. Particularly preferable examples of the organic boron salts are salts of an organic boron anion and an onium ion. Specific examples thereof include ammonium salts such as tetraalkylammonium salts, sulfonium salts such as triarylsulfonium salts, and phosphonium salts such as triarylalkylphosphonium salts.

Particularly preferable examples of the organic boron salts are those shown below, BC-1 to BC-6.

(BC-1)

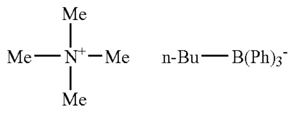

(BC-2)

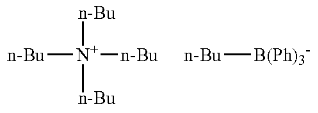

(BC-3)

n-Bu—$P(Ph)_3^+$ n-Bu—$B(Ph)_3^-$

-continued (BC-4)

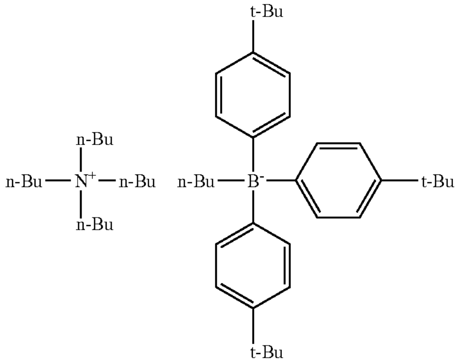

(BC-5)

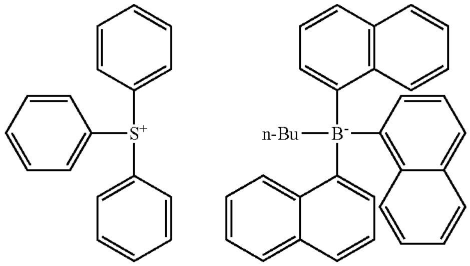

(BC-6)

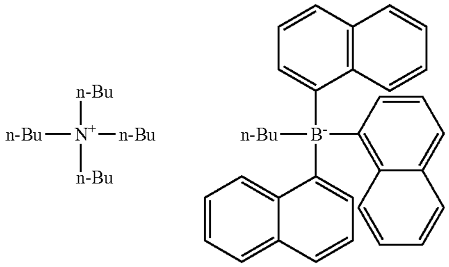

Other preferable radical generators in the invention are trihaloalkyl-substituted compounds. Specifically, the trihaloalkyl-substituted compounds are compounds having at least one trihaloalkyl group such as a trichloromethyl or tribromomethyl group in the molecule. Preferable examples thereof include s-triazine derivatives and oxadiazole derivatives wherein the trihaloalkyl group is connected to a nitrogen-containing heterocyclic group. Trihaloalkylsulfonyl compounds wherein the trihaloalkyl group is connected via a sulfonyl group to an aromatic ring or nitrogen-containing heterocycle are also included therein.

Particularly preferable examples of the compounds wherein the trihaloalkyl group is connected to a nitrogen-containing heterocyclic group include compounds of (T-1) to (T-15), and particularly preferable examples of the trihaloalkylsulfonyl compounds include compounds of (BS-1) to (BS-10) shown below.

(T-1)

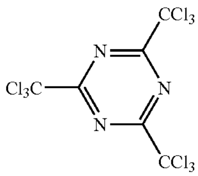

-continued (T-2)

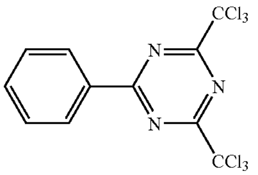

(T-3)

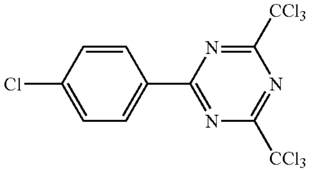

(T-4)

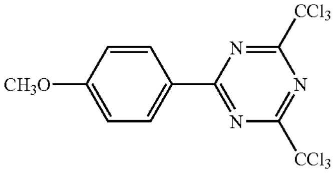

(T-5)

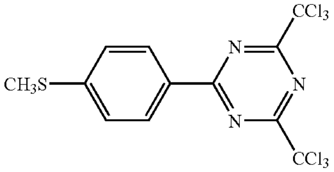

(T-6)

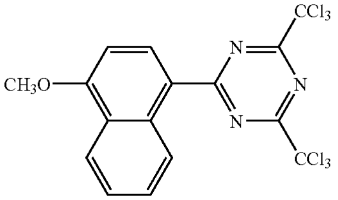

(T-7)

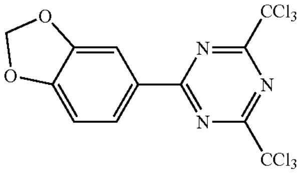

(T-8)

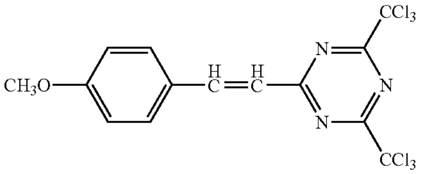

(T-9)

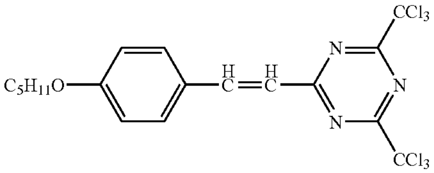

-continued (T-10)

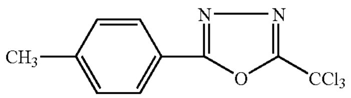

(T-11)

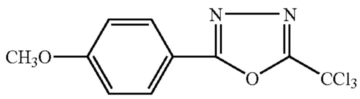

(T-12)

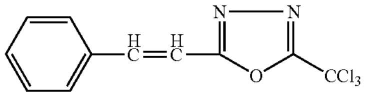

(T-13)

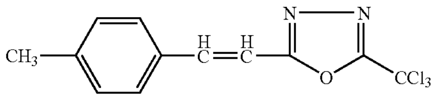

(T-14)

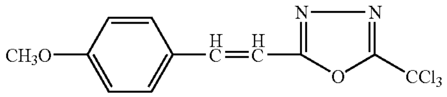

(T-15)

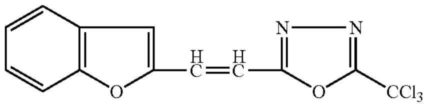

(BS-1)

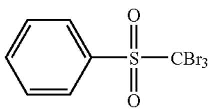

(BS-2)

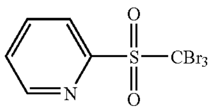

(BS-3)

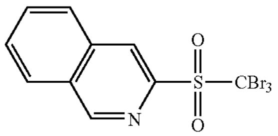

(BS-4)

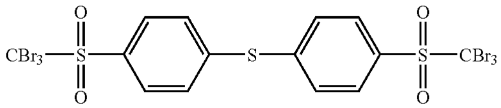

(BS-5)

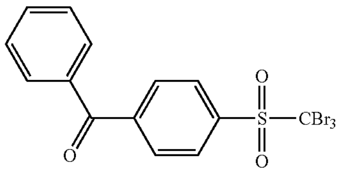

(BS-6)

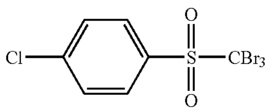

-continued (BS-7)

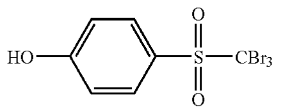

(BS-8)

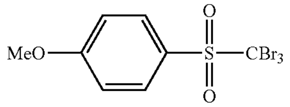

(BS-9)

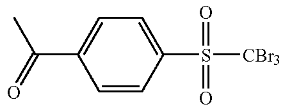

(BS-10)

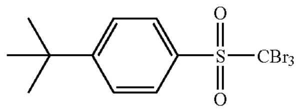

Other preferable radical generators in the invention include organic peroxides. Examples of the organic peroxides include cumene hydroperoxide, t-butyl hydroperoxide, dichloroperoxide, di-t-butyl peroxide, benzoyl peroxide, acetyl peroxide, lauroyl peroxide, a compound having the structure shown below, and the like.

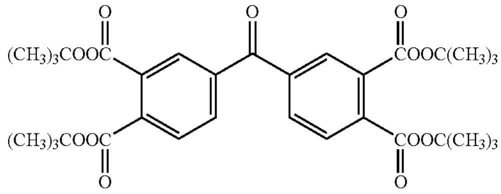

The content of the radical generator described above is preferably in the range of 1 to 100% and more preferably in the range of 1 to 40% by mass with respect to the polymer having a phenyl group substituted with a vinyl group on the side chain (particular polymer) described below.

[Polymer having a Phenyl Group Substituted with a Vinyl Group on the Side Chain (Binder Polymer)]

In the invention, the polymer having a phenyl group substituted with a vinyl group on the side chain (hereinafter, referred to as "particular polymer"), which is used as a binder polymer, is a polymer wherein the phenyl group substituted with a vinyl group is connected directly or via a connecting group to the main chain. The connecting groups are not particularly limited, and include any group or atom, or a group containing both of them. In addition, the phenyl group may be substituted with any substituting group(s) or atom(s) in addition to the vinyl group. Specific examples of the substituting groups and atoms include halogen atoms; carboxy, sulfo, nitro, cyano, amido, amino, alkyl, aryl, alkoxy, and aryloxy groups. In addition, the vinyl group may be substituted with a halogen atom; a carboxy, sulfo, nitro, cyano, amido, amino, alkyl, aryl, alkoxy, or aryloxy group; and the like.

The polymers having a phenyl group substituted with a vinyl group on the side chain described above are more specifically polymers having a group represented by the following Formula (2) on a side chain.

Formula (2)

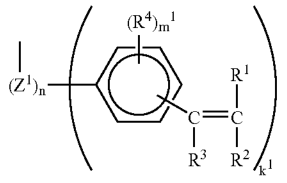

In Formula (2), $Z^1$ represents a connecting group. $R^1$, $R^2$, and $R^3$ each independently represent a hydrogen atom, a halogen atom, an carboxy group, a sulfo group, a nitro group, a cyano group, an amido group, an amino group, an alkyl group, an aryl group, an alkoxy group, or an aryloxy group, and each of these groups may be substituted with an alkyl group, an amino group, an aryl group, an alkenyl group, a carboxy group, a sulfo group, or a hydroxy group; and the like. $R^4$ represents a substituting group or atom. n is 0 or 1; $m^1$ is an integer of 0 to 4; and $k^1$ is an integer of 1 to 4.

Examples of the group represented by Formula (2) will be described in more detail. Examples of the connecting groups represented by $Z^1$ include oxygen and sulfur atoms; alkylene, alkenylene, arylene, —N($R^5$)—, —C(O)—O—, —C($R^6$)=N—, —C(O)—, and sulfonyl groups; groups shown below; and groups having a single heterocyclic structure or 2 or more heterocyclic structures. Here, $R^5$ and $R^6$ each represent a hydrogen atom, an alkyl or aryl group. Further, the connecting group may have additionally one or more substituents such as alkyl and aryl groups, halogen atoms.

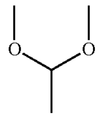

The heterocyclic structures in the connecting group represented by $Z^1$ include nitrogen-containing heterocycles of pyrrole, pyrazole, imidazole, triazole, tetrazole, isoxazole, oxazole, oxadiazole, isothiazole, thiazole, thiadiazole, thiatriazole, indole, indazole, benzimidazole, benzotriazole, benzoxazole, benzothiazole, benzoselenazole, benzothiadiazole, pyridine, pyridazine, pyrimidine, pyrazine, triazine, quinoline and quinoxaline; furan rings; thiophene rings, and the like. These heterocyclic structures may further have one or more substituents such as alkyl, amino, aryl, alkenyl, carboxy, sulfo, and hydroxy groups.

Examples of the substituting group or atoms represented by $R^4$ include halogen atoms; carboxy, sulfo, nitro, cyano, amido, amino, alkyl, aryl, alkoxy, and aryloxy groups, and further these groups or atoms may have one or more substituents such as alkyl, amino, aryl, alkenyl, carboxy, sulfo, and hydroxy groups.

Specific examples of the groups represented by the following Formula (2) are groups shown below (K-1) to (K-20). However, the invention is not restricted to these specific examples.

(K-1)

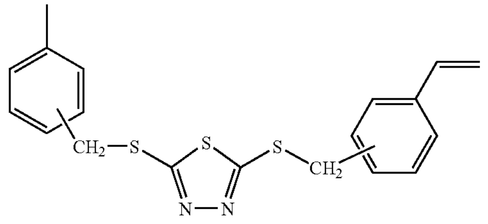

(K-2)

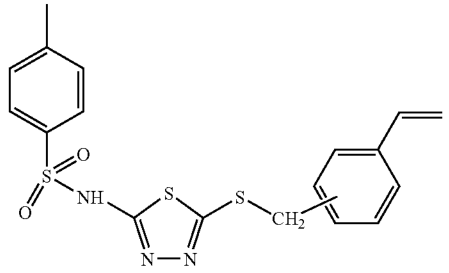

(K-3)

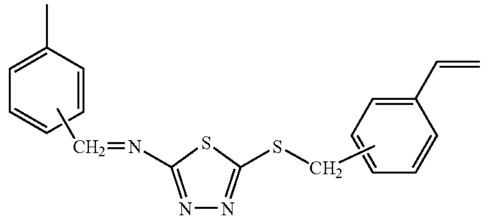

(K-4)

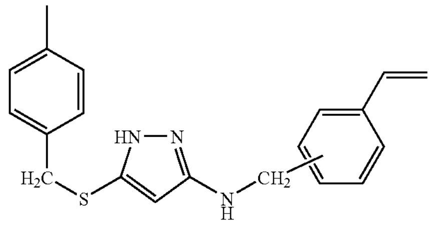

(K-5)

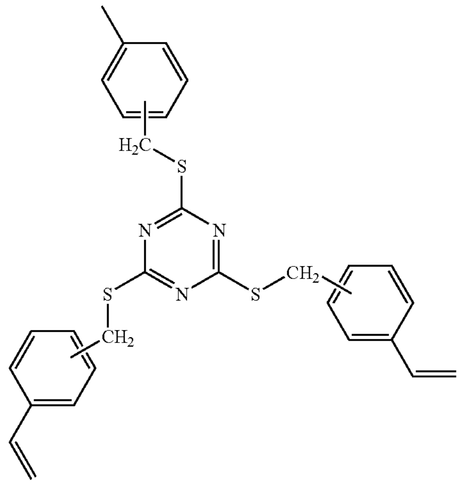

-continued (K-6)

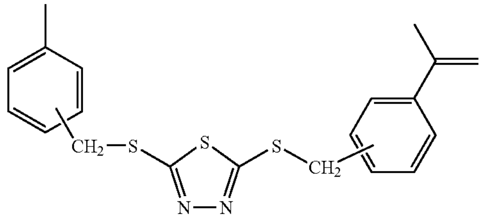

(K-7)

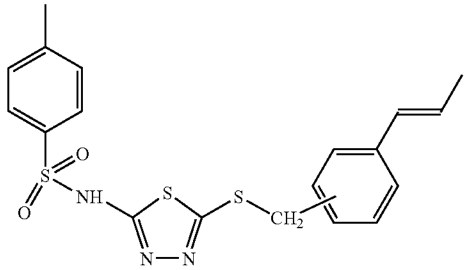

(K-8)

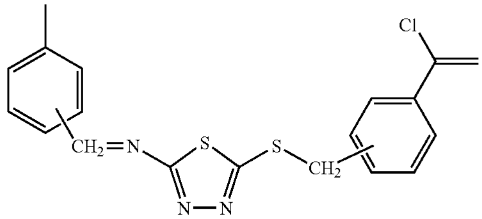

(K-9)

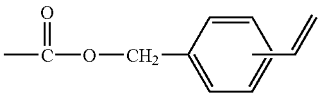

(K-10)

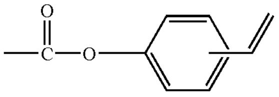

(K-11)

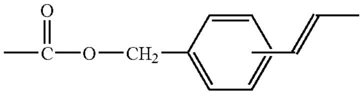

(K-12)

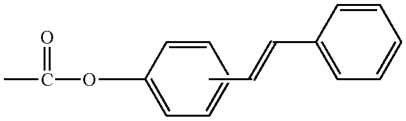

(K-13)

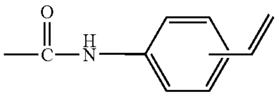

(K-14)

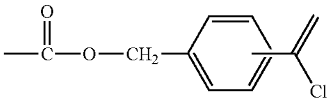

(K-15)

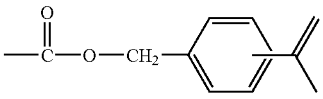

-continued (K-16)

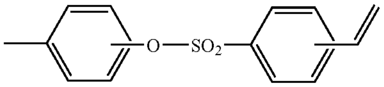

(K-17)

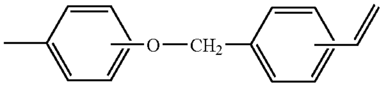

(K-18)

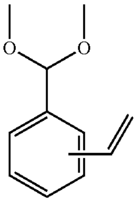

(K-19)

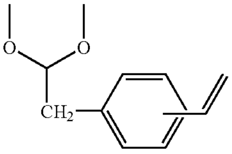

(K-20)

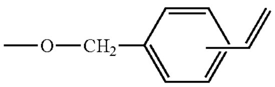

Among the groups represented by Formula (2), the groups having the structures described below are preferable. That is, groups wherein $R^1$ and $R^2$ in Formula (2) are a hydrogen atom and $R^3$ is a hydrogen atom or a lower alkyl group having 4 or less carbons (methyl and ethyl groups, and the like) are preferable. Further, the connecting group represented by $Z^1$ is preferably a group containing a heterocyclic structure. $k^1$ is preferably 1 or 2.

The particular polymers according to the invention are preferably soluble in aqueous alkaline solution. Thus, the particular polymers according to the invention particularly preferably include a copolymer containing a carboxyl group-containing monomer as the comonomer component as well as the polymers having a phenyl group substituted with a vinyl group (more specifically, the group represented by Formula (2)).

In such a case, the content of the monomer having a phenyl group substituted with a vinyl group (group represented by Formula (2)) in the copolymer composition is preferably 1% to 95%, more preferably 10% to 80%, and still more preferably 20% to 70% by mass with respect to 100% by mass of all composition. If the content is below the range, advantageous effects of the addition may not be observed. On the contrary, if the content is 95% or more by weight, the copolymer may not be soluble in aqueous alkaline solution.

Further, the content of the carboxyl group-containing monomer in copolymer is preferably in the same range of 5% to 99% by mass. If the content thereof is lower than the range, the copolymer may not be soluble in aqueous alkaline solution.

Examples of the carboxyl group-containing monomers used as comonomer component include acrylic acid, methacrylic acid, acrylic acid 2-carboxyethylester, methacrylic acid 2-carboxyethylester, crotonic acid, maleic acid, fumaric acid, maleic acid monoalkylester, fumaric acid monoalkylester and 4-carboxystyrene.

In addition, the particular polymers according to the invention may additionally contain carboxyl groups, by using a polyacetal having a benzoic acid moiety on a side chain, a carboxybenzaldehyde-modified polyvinyl alcohol, and the like as the comonomer component for the particular copolymers.

The polymers having a phenyl group substituted with a vinyl group on the side chain (particular polymer) according to the invention may be multi-component copolymers prepared by copolymerizing other monomer components together with the monomer having a carboxyl group therein. In such a case, examples of the monomers to be introduced into the copolymers include styrene derivatives such as styrene, 4-methylstyrene, 4-hydroxystyrene, 4-acetoxystyrene, 4-carboxystyrene, 4-aminostyrene, chloromethylstyrene, and 4-methoxystyrene;

methyl methacrylate, ethyl methacrylate, butyl methacrylate, hexyl methacrylate, methacrylic acid alkylesters such as 2-ethylhexyl methacrylate, cyclohexyl methacrylate, and dodecyl methacrylate;

methacrylic acid arylesters or alkylarylesters such as phenyl methacrylate and benzyl methacrylate;

methacrylic esters having an alkyleneoxy group such as 2-hydroxyethyl methacrylate, 2-hydroxypropyl methacrylate, methacrylic acid methoxydiethylene glycol monoester, methacrylic acid methoxypolyethylene glycol monoester, and methacrylic acid polypropylene glycol monoester;

methacrylic esters containing an amino group such as 2-dimethylaminoethyl methacrylate and 2-diethylaminoethyl methacrylate;

acrylic esters corresponding to these methacrylic esters above;

monomers having a phosphate group such as vinylphosphonic acid;

monomers having an amino group such as allylamine and diallylamine;

monomers having a sulfonate group such as vinylsulfonic acid and the salts thereof, allylsulfonic acid and the salts thereof, methallylsulfonic acid and the salts thereof, styrenesulfonic acid and the salts thereof, and 2-acrylamido-2-methylpropanesulfonic acid and the salts thereof;

monomers having a nitrogen-containing heterocyclic group such as 4-vinylpyridine, 2-vinylpyridine, N-vinylimidazole, an N-vinylcarbazole;

monomers having a quaternary ammonium salt group such as 4-vinylbenzyl-trimethylammonium chloride, acryloyloxyethyl-trimethylammonium chloride, methacryloyloxyethyl-trimethylammonium chloride, the quaternary ammonium salt prepared from dimethylaminopropylacrylamide methyl chloride, the quaternary ammonium salt prepared from N-vinylimidazole methyl chloride, and 4-vinylbenzylpyridinium chloride;

acrylamide or methacrylamide derivatives such as acrylamide, methacrylamide, dimethylacrylamide, diethylacrylamide, N-isopropylacrylamide, diacetone acrylamide, N-methylol acrylamide, N-methoxyethylacrylamide, and 4-hydroxyphenylacrylamide;

vinyl esters such as acrylonitrile, methacrylonitrile, vinyl acetate, vinyl chloroacetate, vinyl propionate, vinyl butyrate, vinyl stearate, and vinyl benzoate; and vinyl ethers such as methylvinylether and butylvinylether.

In addition, various monomers such as phenylmaleimide, hydroxyphenylmaleimide, N-vinylpyrrolidone, acryloylmorpholine, tetrahydrofurfuryl methacrylate, vinyl chloride, vinylidene chloride, allyl alcohol, vinyltrimethoxysilane, and glycidyl methacrylate may be used if necessary.

These monomers may be added in an arbitrary amount to the copolymer, if the contents in the copolymer of the monomer having the group represented by Formula (2) and the carboxyl group-containing monomer are kept in the preferable ranges described above.

The molecular weight of the polymer above is preferably in the range of 1,000 to 1,000,000, more preferably in the range of 10,000 to 300,000 as weight average molecular weight.

Examples of the polymers having, on a side chain, the groups represented by Formula (2) according to the invention include polymers of (P-1) to (P-13) shown below. Numbers indicated in the structure formulae represent the contents (% by mass) of each recurring unit in 100% by mass of all copolymer components.

(P-1)

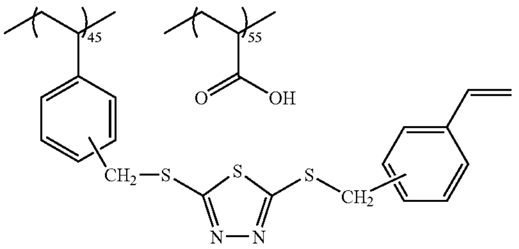

(P-2)

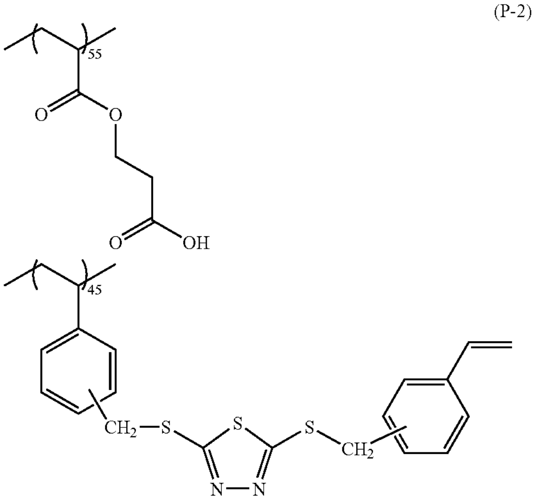

(P-3)

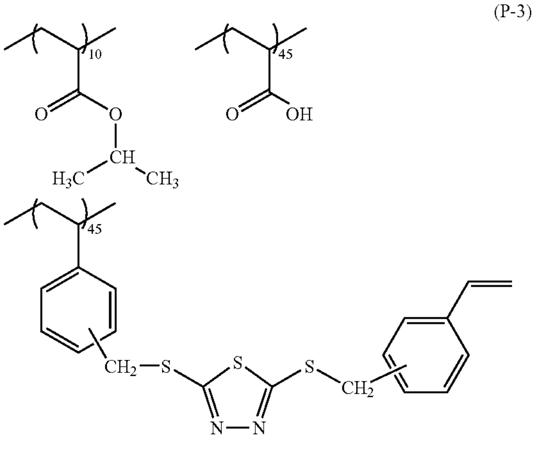

-continued
(P-4)
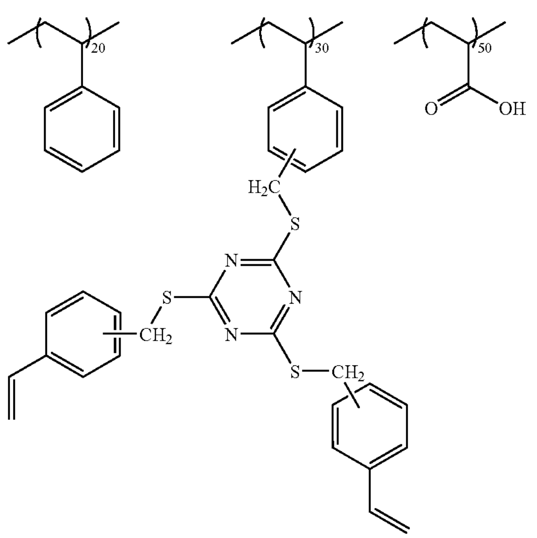
(P-5)
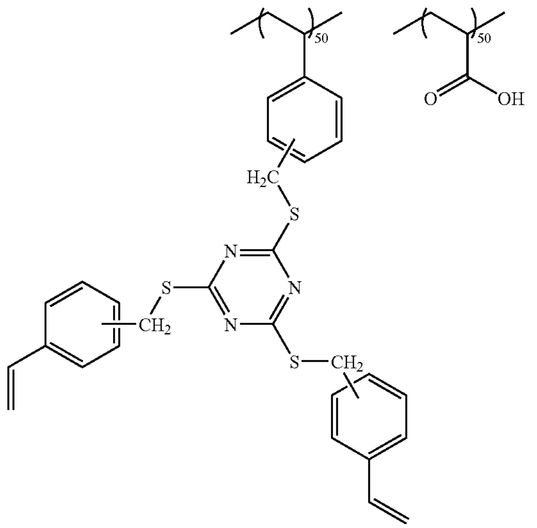
(P-6)
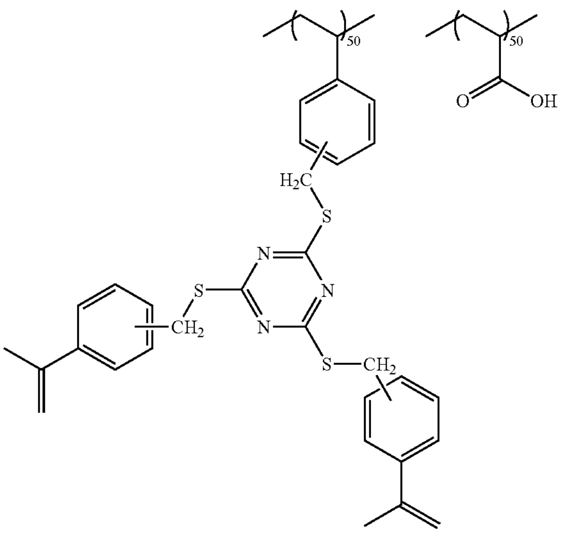
-continued
(P-7)
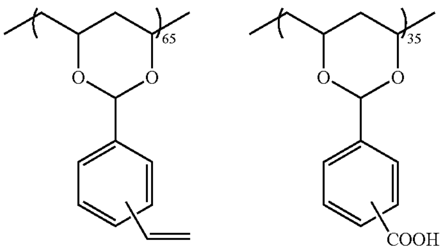
(P-8)
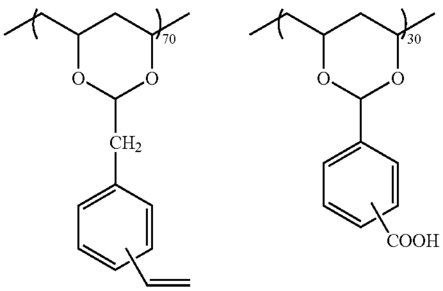
(P-9)
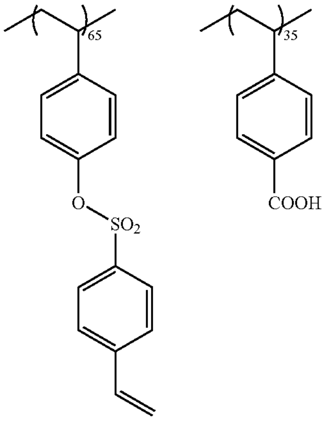
(P-10)
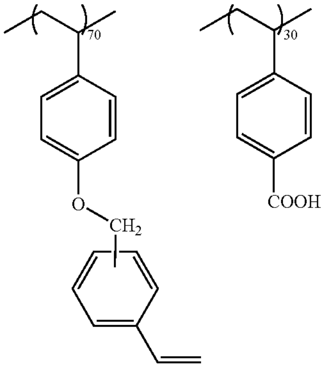

-continued (P-11)

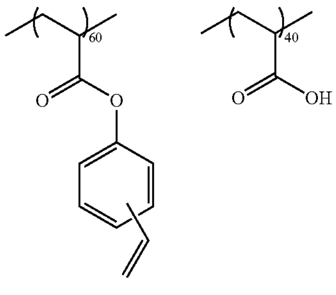

(P-12)

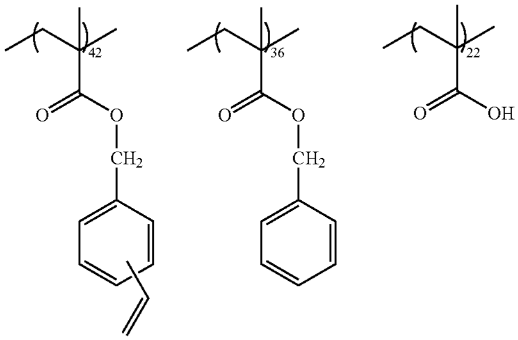

(P-13)

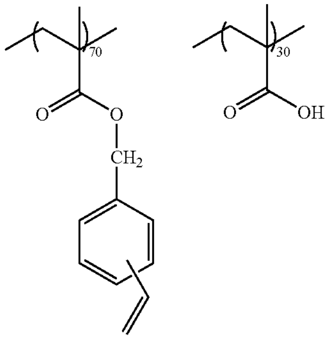

The particular polymers may be used alone or in combination of two or more, as the binder polymer according to the invention.

These binder polymers are added in an amount of 10 to 90%, preferably 20 to 80% by mass respect to the total solid content contained in the photosensitive composition, from the viewpoints of improving the strength (layer-forming properties and film strength) and the image-forming property of image portions.

Additionally, the particular polymer according to the invention may be used together with other publicly known binder polymers in the amount that does not impair the advantageous effects of the particular polymer.

[Monomer having Two or More Phenyl Groups Substituted with a Vinyl Group (Polymerizable Compound)]

The monomer having two or more phenyl groups substituted with a vinyl group (hereinafter, referred to as "particular monomer"), which is used as the polymerizable compound according to the invention, cross-links efficiently by recombination of the styryl radicals triggered by the radicals which was previously generated by the radical generator described above. Therefore, the photosensitive composition according to the invention containing these components may be used preferably for the highly sensitive negative recording layers that do not require a heating treatment.

The specific examples of the particular monomers according to the invention are compounds represented by the following Formula (3).

Formula (3)

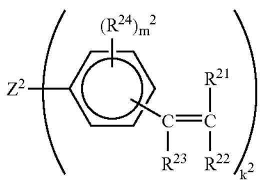

In Formula (3), $Z^2$ represents a connecting group. $R^{21}$, $R^{22}$ and $R^{23}$ each independently represent a hydrogen atom, a halogen atom, an carboxy group, a sulfo group, a nitro group, a cyano group, an amido group, an amino group, an alkyl group, an aryl group, an alkoxy group, or an aryloxy group. Further, these groups may be substituted with an alkyl group, an amino group, an aryl group, an alkenyl group, a carboxy group, a sulfo group, or a hydroxy group. $R^{24}$ represents a substituting group or atom. $m^2$ is an integer of 0 to 4. $k^2$ is an integer of 2 or more.

The compound represented by Formula (3) will be described in more detail. Examples of the connecting groups represented by $Z^2$ include oxygen and sulfur atoms; alkylene, alkenylene, arylene, —N($R^5$)—, —C(O)—O—, —C($R^6$)=N—, —C(O)—, and sulfonyl groups; and groups having a single or 2 or more heterocyclic structures, benzene ring structures, and the like. Herein, $R^5$ and $R^6$ each represent a hydrogen atom, an alkyl or aryl group. The connecting group may have one or more substituents such as alkyl and aryl groups and halogen atoms.

The heterocyclic structures in the connecting group represented by $Z^2$ include nitrogen-containing heterocyclic moieties such as pyrrole, pyrazole, imidazole, triazole, tetrazole, isoxazole, oxazole, oxadiazole, isothiazole, thiazole, thiadiazole, thiatriazole, indole, indazole, benzimidazole, benzotriazole, benzoxazole, benzothiazole, benzoselenazole, benzothiadiazole, pyridine, pyridazine, pyrimidine, pyrazine, triazine, quinoline, and quinoxaline; furan rings; thiophene rings; and the like. These heterocyclic structures may further have one or more substituents such as alkyl, amino, aryl, alkenyl, carboxy, sulfo, and hydroxy groups.

The substituting groups or atoms represented by $R^{24}$ include halogen atoms; carboxy, sulfo, nitro, cyano, amido, amino, alkyl, aryl, alkoxy, and aryloxy groups. Further, these groups or atoms may have additionally one or more substituents such as alkyl, amino, aryl, alkenyl, carboxy, sulfo, and hydroxy groups.

Among the compounds represented by Formula (3), compounds having the following structures are preferable. That is, groups wherein $R^{21}$ and $R^{22}$ in Formula (3) are a hydrogen atom and $R^{23}$ is a hydrogen atom or a lower alkyl group having 4 or less carbons (methyl, ethyl groups, and the like) and $k^2$ is an integer of 2 to 10 are preferable.

Hereinafter, specific examples of the compounds represented by Formula (3) are shown, i.e., (C-1) to (C-11), but the invention is not restricted to these examples.

(C-1)
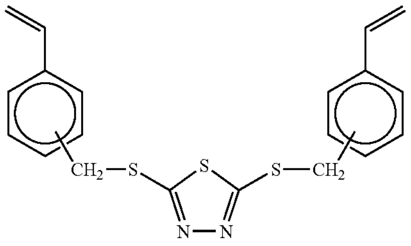
(C-2)
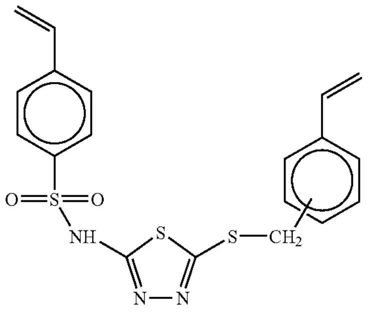
(C-3)
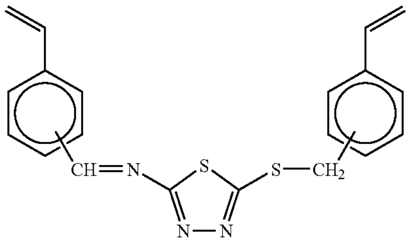
(C-4)
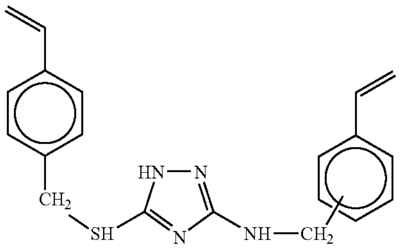
(C-5)
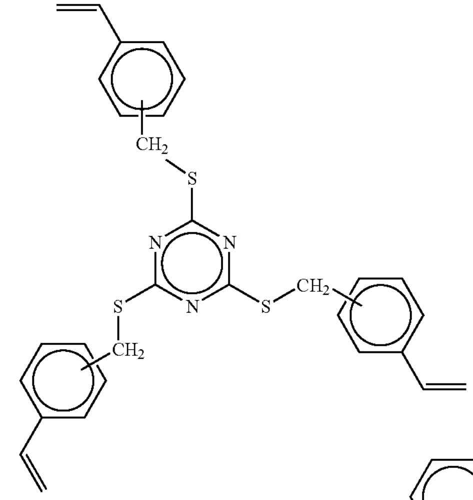
(C-6)
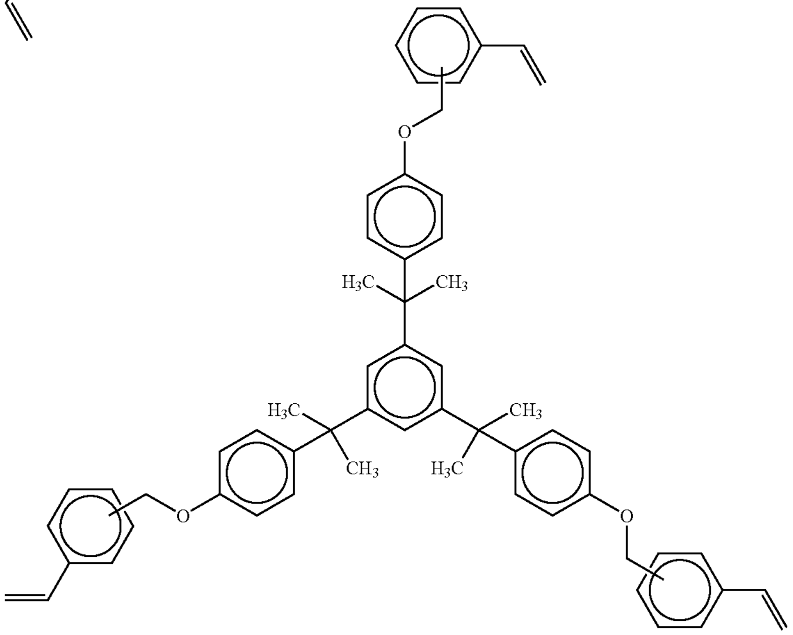

-continued
(C-7)
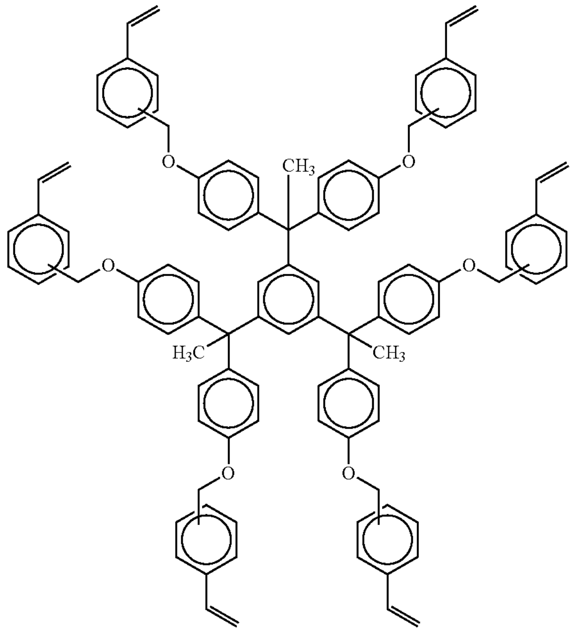
(C-8)
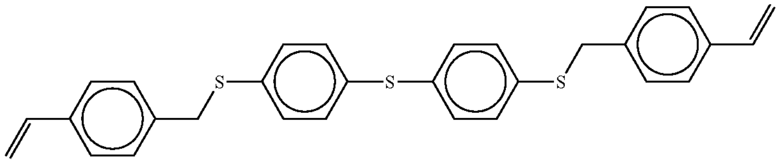
(C-9)
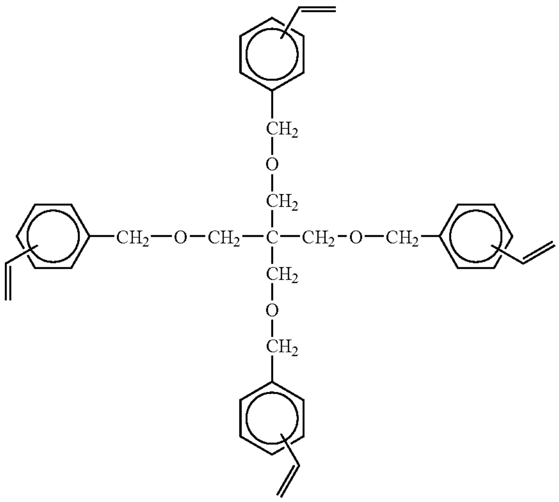
(C-10)
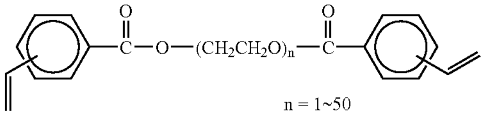
n = 1~50
(C-11)
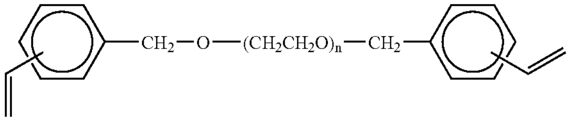
n = 1~50

These particular monomers used as the polymerizable compound in the invention may be used alone or in combination of two or more.

The amount of the particular monomer added is preferably in the range of 0.01 to 10 part by mass, more preferably in the range of 0.05 to 1 part by mass, with respect to 1 part by mass of the polymer having a phenyl group substituted with a vinyl group on the side chain (particular polymer) described above.

Further, the particular monomer according to the invention may be used together with other publicly known polymerizable compounds if they are added in the amount that does not impair the advantageous effects of the particular monomer.

[Infrared Absorbent]

The infrared absorbing agent used in the invention functions to convert absorbed infrared ray into heat and to generate excited electrons. When light is absorbed by the infrared absorbing agent, the radical generator described above decomposes to generate radicals.

The infrared absorbing agents used in the invention are dyes or pigments having an absorption maximum at a wavelength of 760 nm to 1,200 nm.

The dyes include commercially available dyes and publicly known dyes described in literatures, for example, "Dye Handbook" (Edited by the Society of Synthetic Organic Chemistry, Japan, 1970) and the like. Specific examples of the dyes include azo dyes, metal complex salt azo dyes, pyrazolone azo dyes, naphthoquinone dyes, anthraquinone dyes, phthaloryanine dyes, carbonium dyes, quinonimine dyes, methine dyes, cyanine dyes, squalelium dyes, pyrylium salts and metal thiolate complexes.

Preferable examples of the dyes include cyanine dyes described in JP-A Nos. 58-125246, 59-84356, 59-202829, and 60-78787; methine dyes described in JP-A Nos. 58-173696, 58-181690, and 58-194595; naphthoquinone dyes described in JP-A Nos. 58-112793, 58-224793, 59-48187, 59-73996, 60-52940, and 60-63744; squalelium dyes described in JP-A No. 58-112792 and the like; cyanine dyes described in U.K. Patent No. 434,875; and the like.

In addition, infrared-absorbing sensitizers described in U.S. Pat. No. 5,156,938 may also be used preferably. In addition, arylbenzo(thio)pyrylium salts described in U.S. Pat. No. 3,881,924; trimethine thiapyrylium salts described in JP-A No. 57-142645 (U.S. Pat. No. 4,327,169); pyrylium compounds described in JP-A Nos. 58-181051, 58-220143, 59-41363, 59-84248, 59-84249, 59-146063, and 59-146061; cyanine dyes described in JP-A No. 59-216146; pentamethine thiopyrylium salts and the like described in U.S. Pat. No. 4,283,475; and pyrylium compounds described in Japanese Patent Application Publication (JP-B) Nos. 5-13514 and 5-19702 may also be used preferably. The other preferable examples of the dyes include the infrared-absorbing dyes described as Formulae (I) and (II) in U.S. Pat. No. 4,756,993.

Specific examples of the dyes preferably used as the infrared absorbing agents include dyes of (S-1) to (S-14) below. However, the invention is not restricted to these examples.

(S-1)

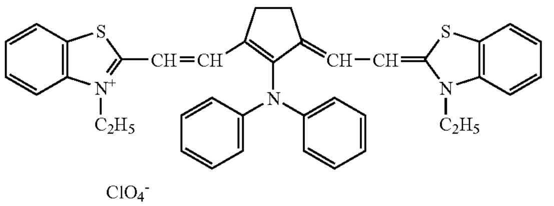

(S-2)

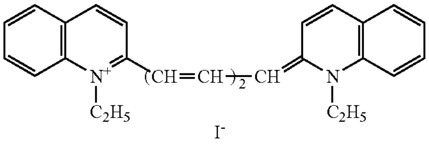

(S-3)

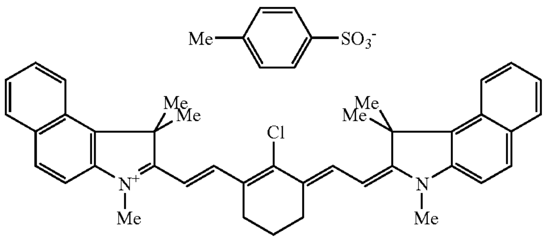

(S-4)

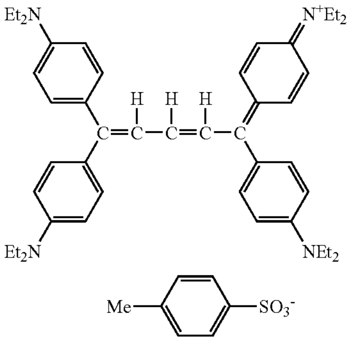

(S-5)

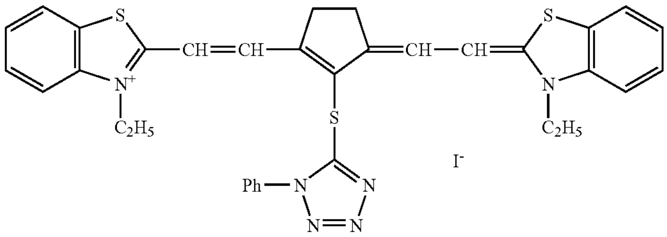

-continued
(S-6)
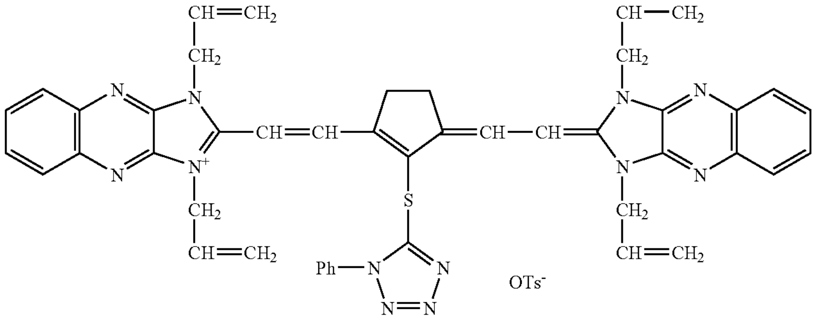
(S-7)
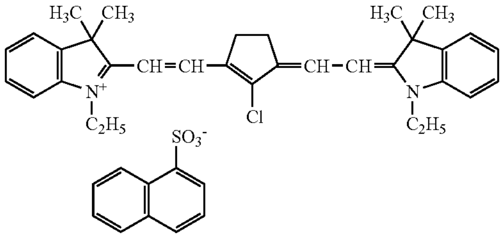
(S-8)
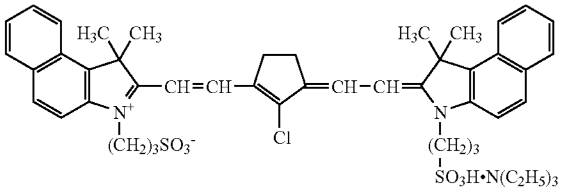
(S-9)
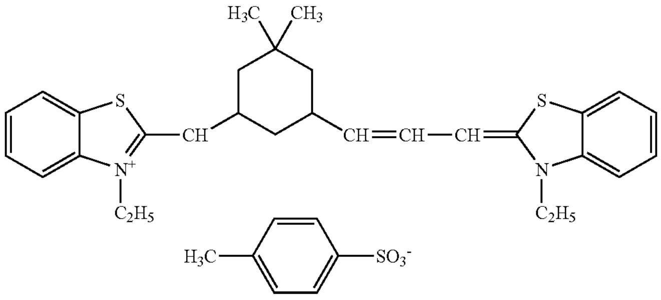
(S-10)
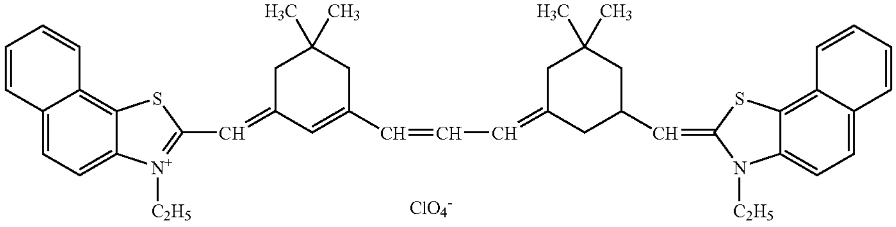
(S-11)
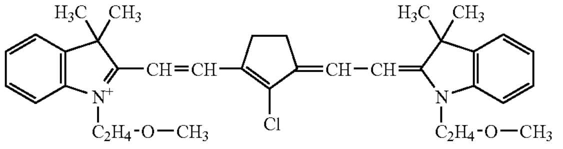
(S-12)
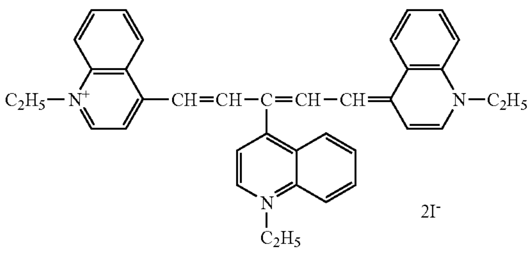

-continued (S-13)

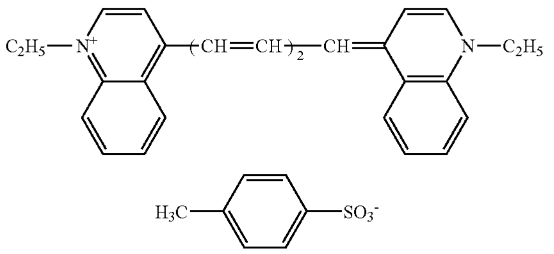

(S-14)

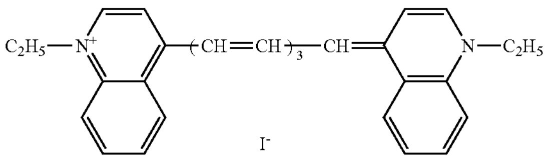

As described above, infrared absorbing agents having an organic boron anion as the counter anion for the infrared absorbing agents (cationic sensitizing dyes) exemplified here may also be used in the similar manner.

These dyes may be used alone or in combination of two or more.

For applying the photosensitive composition according to the invention to planographic printing plate precursors, the content of the dye as the infrared absorbing agent is preferably about 3 to 300 mg per 1 $m^2$ of the negative recording layer. The content is more preferably 10 to 200 $mg/m^2$.

The pigments used in the invention include commercially available pigments and the pigments described in Color Index (C.I.) Handbook, "Pigment Handbook" (Japan Society of pigment technologies, ed., 1977), "State-of-the-art Pigment Application Technologies" (published by CMC Publishing in 1986), and "Printing Ink technologies" (published by CMC Publishing, 1984).

The pigments include black, yellow, orange, brown, red, purple, blue, green, fluorescent, and metal powder pigments, as well as polymer-bound dyes. Specific examples thereof include insoluble azo pigments, azolake pigments, condensation azo pigments, chelate azo pigments, phthaloryanine pigments, anthraquinone pigments, perylene and perynone pigments, thioindigo pigments, quinacridone pigments, dioxazine pigments, isoindolinone pigments, quinophtharone pigments, dyed lake pigments, azine pigments, nitroso pigments, nitro pigments, natural pigments, fluorescent pigments, inorganic pigments, carbon black, and the like. Among these pigments, carbon black is preferable.

These pigments may be used with or without a surface treatment. The methods of the surface treatment include methods of coating a resin or wax onto the surface, applying a surfactant, binding a reactive substance (e.g., a silane coupling agent, epoxy compound, polyisocyanate, and the like) to the pigment surface, and the like. The surface treatment methods above are described in "Properties and Applications of Metal Soaps" (Saiwai Shobo), "Printing Ink technologies" (CMC Publishing, 1984) and "State-of-the-art Pigment Application Technologies" (published by CMC Publishing in 1986).

The particle diameter of the pigment is preferably in the range of 0.01 to 10 μm, more preferably in the range of 0.05 to 1 μm, and still more preferably in the range of 0.1 to 1 μm. In this preferably range in diameter, the pigments provide the resulting photosensitive compositions excellent in dispersion stability and consequently more uniform negative recording layers when applied to planographic printing plate precursors.

Any one of the publicly known dispersion techniques for producing inks and toners may be used as the method of dispersing the pigments according to the invention. The dispersing machines that may be used include ultrasonic dispersing machines, sand mills, attritor, pearl mills, super mills, ball mills, impellers, dispersers, KD mills, colloid mills, dynatrons, triple roll mills, press kneaders, and the like. Detailed methods are described in "State-of-the-art Pigment Application Technologies" (published by CMC Publishing in 1986).

These pigments used as infrared absorbing agents are preferably contained in an amount of 0.01 to 50%, more preferably 0.1 to 10%, and particularly preferably 0.1 to 10% by mass, with respect to the total solid content contained in the photosensitive composition, from the viewpoints of the uniformity and durability of the resulting photosensitive compositions when they are applied to negative recording layers.

In addition to the essential components described above, other components suitable for the applications and manufacturing methods of the photosensitive compositions according to the invention may be added accordingly thereto. Hereinafter, examples of the other preferable components are described.

[Polymerization Inhibitor]

A small amount of a thermal polymerization inhibitor is preferably added to the photosensitive composition according to the invention, for prevention of unnecessary thermal polymerization of the compound having a polymerizable ethylenic unsaturated double bond, i.e., the particular monomer (polymerizable compound). The thermal polymerization inhibitor is preferably added to the photosensitive composition during the production or storage thereof. Suitable examples of the thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), cerous N-nitrosophenylhydroxyamine salts, and the like. The amount of the thermal polymerization inhibitor added is preferably about 0.01 to about 5% by mass with respect to the total mass of the nonvolatile components in the composition.

A higher aliphatic acid derivative such as behenic acid or behenic amide, and the like may be added if necessary for prevention of the polymerization inhibition due to oxygen, when the photosensitive composition according to the invention is applied to planographic printing plate precursors. The higher aliphatic acid derivative may be localized at the surface of negative recording layers, as added during the drying step after application. The amount of the higher aliphatic acid derivative added is preferably about 0.5 to about 10% by mass with respect to the total nonvolatile components in the composition.

[Coloring Agent]

A dye or pigment may also be added to the photosensitive composition according to the invention for the purpose of coloration. In this manner, when the photosensitive composition according to the invention is applied to planographic printing plate precursors, it is possible to improve so-called plate-checking properties such as the visibility of printing plates after plate-making and the applicability for image densitometer. A dye or pigment is preferable as the coloring agent. Specific examples thereof include pigments such as phthaloryanine pigments, azo pigments, carbon black, and titanium oxide; and dyes such as ethyl violet, crystal violet, azo dyes, anthraquinone dyes, and cyanine dyes. The amount of the dye and pigment added as the coloring agents is preferably about 0.5 to about 5% by mass with respect to the total nonvolatile components in the composition. If a dye is used, the dye preferably contains no halide ion as the counter anion.

[Other Additives]

Depending on applications, an oxygen-removing agent such as phosphine, phosphonate, and phosphite; reducing agent, antifading agent, surfactant, plasticizer, antioxidant, ultraviolet absorbent, antimildew agent, antistatic agent, or other additive for providing the photosensitive composition with a variety of properties may be added thereto according to the invention together with a dilution solvent.

Alternatively, other publicly know additives including inorganic fillers and other plasticizers for improvement in physical properties of cured films and sensitizing agents for improvement in the inking property of the negative recording layer surfaces when the photosensitive composition according to the invention is applied to planographic printing plate precursors may also be added.

Examples of the plasticizers include dioctyl phthalate, didodecyl phthalate, triethylene glycol dicaprylate, dimethylglycol phthalate, tricresyl phosphate, dioctyl adipate, dibutyl sebacate, triacetylglycerin, and the like. The amount of the plasticizer added is generally in the range of 10% by mass or less with respect to the total amount of the particular polymer (binder polymer) and the particular monomer.

Further, a UV initiator, heat cross-linking agent and the like may also be added to enhance the effects of heating and exposure after development for the purpose of increasing the film strength (printing durability) described below.

Furthermore, a polymerization promoter, chain transfer agent, and the like represented by an amine, thiol, and disulfide may also be added for accelerating polymerization. Specific examples thereof include N-phenylglycine, triethanolamine, N,N-diethylaniline, and the like.

<Planographic Printing Plate Precursor>

The planographic printing plate precursor according to the invention has a negative recording layer containing the photosensitive composition according to the invention formed on a substrate. The precursor may also have another layer such as an intermediate layer (undercoating layer) if necessary.

Hereinafter, each element of the planographic printing plate precursor according to the invention will be described separately.

[Negative Recording Layer]

Image portions are formed on the negative recording layer according to the invention by the mechanism described below.

That is, an infrared absorbing agent therein absorbs infrared ray and convert it into heat. The heat and/or light generated at the time result in generation of radicals by the compound that generates a radical by application of light or heat (radical generator) therein. The radicals thus generated in turn induce as the initiator the polymerization of a monomer having two or more phenyl groups substituted with a vinyl group (particular monomer) to proceed in chain reaction. Because a polymer having on a side chain a phenyl group substituted with a vinyl group (particular polymer) is present as the binder polymer in the invention, the radicals generated by the radical generator component generate styryl radicals. The styryl radicals bind then to each other and cross-link the irradiated portions efficiently, producing films hydrophobic by nature. As a result, surfaces excellent in development endurance and thus cured films superior in various properties can be obtained.

In this manner, combined presence of a compound that generates a radical by application of light or heat (radical generator) and an infrared absorbing agent allows the negative recording layers according to the invention containing these components to have a higher sensitivity. It also allows sufficiently high curing of the film, even without additional step of forming an overcoat layer, which prevents the adverse effects of oxygen in the atmosphere. Further, it also eliminates the need for the heating treatment after exposure.

In addition, the negative recording layer according to the invention further has a high and enduring alkali-solubility because of the presence of the particular carboxylic acid compound therein, and thus is also superior in the raw stock storability (stability over time).

The negative recording layer according to the invention is produced by applying a solution of the photosensitive composition according to the invention dissolved in one of a variety of organic solvents onto a substrate or an intermediate layer (undercoating layer).

Examples of the solvents include dioxane, acetone, methylethylketone, cyclohexane, ethyl acetate, ethylene dichloride, tetrahydrofuran, toluene, ethylene glycol monomethylether, ethylene glycol monoethylether, ethylene glycol dimethylether, propylene glycol monomethylether, propylene glycol monoethylether, acetylacetone, cyclohexanone, diacetone alcohol, ethylene glycol monomethylether acetate, ethylene glycol ethylether acetate, ethylene glycol monoisopropylether, ethylene glycol monobutylether acetate, 3-methoxypropanol, methoxymethoxyethanol, diethylene glycol monomethylether, diethylene glycol monoethylether, diethylene glycol dimethylether, diethylene glycol diethylether, propylene glycol monomethylether acetate, propylene glycol monoethylether acetate, 3-methoxypropyl acetate, N,N-dimethylformamide, dimethylsulfoxide, γ-butylolactone, methyl lactate, ethyl lactate, and the like. These solvents may be used alone or as a mixture. The concentration of the solid matters in the coating solution is preferably 2 to 50% by mass.

The coating amount (thickness) of the negative recording layer above is suitably selected according to applications, as it affects mainly the sensitivity and developability of negative recording layer and the strength and printing durability of the exposed film.

For the major object of the invention, i.e., planographic printing plate precursors for scanning exposure, the coating amount is in the range of about 0.1 to about 10 $g/m^2$ as dried mass, from the viewpoints of printing durability, sensitivity, and the like. The coating amount is more preferably 0.5 to 5 $g/m^2$.

(Physical Properties of Negative Recording Layers)

In regard to the physical properties of negative recording layers for planographic printing plate precursors according to the invention, the developing speed of unexposed portions thereof in an alkaline developing solution at a pH of 10 to 13.5 is preferably 80 nm/sec or more, and the permeation rate of the alkaline developing solution into the exposed portions is preferably 100 nF/sec or less.

Here, the developing speed in an alkaline developing solution at a pH of 10 to 13.5 is a value of a film thickness (nm) of negative recording layer divided by a time required for development (sec). The permeation rate of the alkaline developing solution is a value of the rate of change in the electrostatic capacitance (F) of the negative recording layer that is previously coated on a conductive substrate and subsequently immersed in a developing solution.

Hereinafter, methods for determining the "developing speed in an alkaline developing solution" and the "the permeation rate of the alkaline developing solution" in the invention will be described in detail.

[Determination of the Developing Speed in an Alkaline Developing Solution]

As described above, the developing speed of negative recording layer in an alkaline developing solution is a value obtained by dividing the film thickness (nm) of the negative recording layer by the time required for development (sec).

In determining the developing speed according to the invention, as an unexposed negative recording layer coated on an aluminum substrate is immersed in an alkaline developing solution (30° C.) at a constant pH in the range of 10 to 13.5, and the dissolving behavior of the negative recording layer was observed by a DRM interference wave-measuring instrument as shown in FIG. 1. FIG. 1 is a schematic view of the DRM interference wave-measuring instrument used for determining the dissolving behavior of the negative recording layer. The change in film thickness was determined by the interference caused by a light at a wavelength of 640 nm in the invention. If the development behavior is non-swelling development of the negative recording layer surface, the film thickness gradually decreases as the developing time elapses, providing the interference waves corresponding to the resulting film thickness. Alternatively, if the development behavior is the swelling dissolution (or dissolution to remove layer), the film thickness increases by penetration of the developing solution therein and thus the developed film does not provide distinct interference waves.

Under this condition, the measurement is continued until the negative recording layer is completely removed. The developing speed can be obtained from the period required for the film thickness becoming 0, i.e., total development period (sec), and the film thickness (μm) of the negative recording layer, according to the following formula. The negative recording layers higher in the developing speed are judged to have superior developability, as they are more easily removed in the developing solution.

Developing speed (of unexposed portion)=[Negative recording layer thickness (μm)/Total development period (sec)]

[Determination of the Permeation Rate of Alkaline Developing Solution]

The permeation rate of the alkaline developing solution is a value of the rate of change in the electrostatic capacitance (nF) of the negative recording layer that is coated on a conductive substrate and subsequently immersed in a developing solution.

Figure 2:
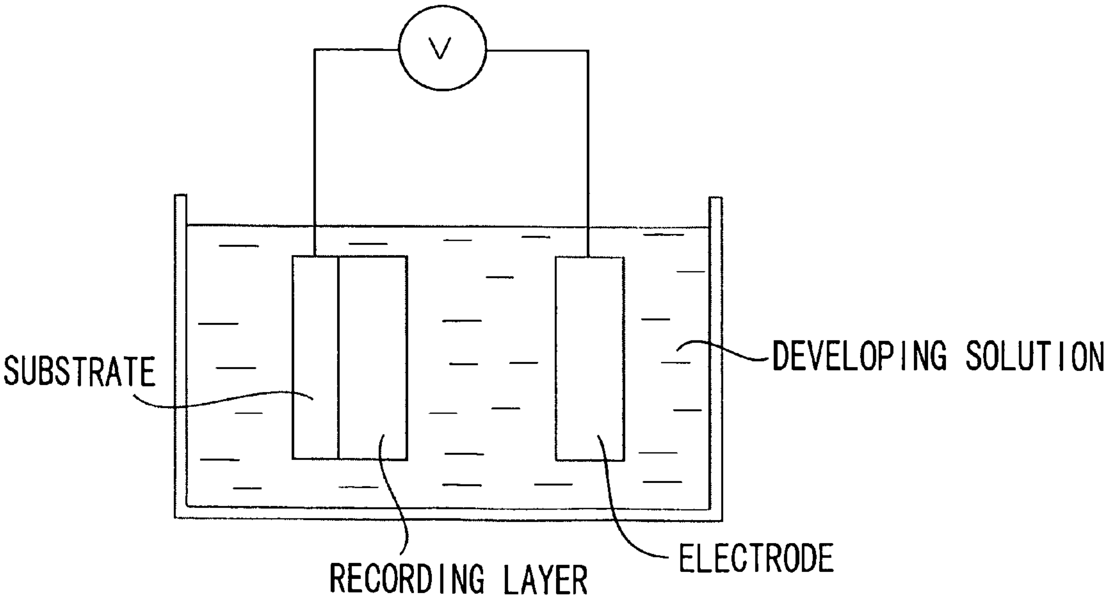
FIG. 2 is a schematic diagram illustrating an example of the apparatus used for determining the electrostatic capacitance for evaluation of the permeability of developing solution into a negative recording layer.

The electrostatic capacitance, i.e., an indicator of the permeability of the alkaline developing solution according to the invention is determined, for example, by a method of applying a voltage between an electrode made of an aluminum substrate and a negative recording layer formed thereon (represented as recording layer in FIG. 2), which is previously exposed to light at a predetermined exposure intensity and cured, and a common electrode, both of which are connected with a conducting wire and immersed in an alkaline developing solution (28° C.) at a consistent pH in the range of 10 to 13.5, as shown in FIG. 2. After application of voltage, the electrostatic capacitance gradually changes over time, as the developing solution penetrates into the interface between the substrate and the negative recording layer.

The permeation rate can be calculated from the time required for constant in electrostatic capacitance (sec) and the saturation value of the electrostatic capacitance of the negative recording layer (nF), according to the following formula. The permeability of developing solution is judged to be lower, if the permeation rate is small.

Developing solution permeation rate (of exposed portion)=[Saturation value of the electrostatic capacitance of the negative recording layer (nF)/Time required for constant in electrostatic capacitance (s)]

In regard to the preferable physical properties of the negative recording layer according to the invention, the developing speed of unexposed portion in an alkaline developing solution at a pH of 10 to 13.5 as determined in the above manner is preferably 80 to 400 nm/sec, and the permeation rate of the alkaline developing solution into negative recording layer is preferably 90 nF/sec or less. Still more preferably, the developing speed of unexposed portion in an alkaline developing solution at a pH of 10 to 13.5 as determined in the above manner is 90 to 200 nm/sec, and the permeation rate of the alkaline developing solution into negative recording layer, 80 nF/sec or less. The upper limit of the developing speed or the lower limit of the permeation rate is not particularly limited, but considering the balance of these values, the developing speed of unexposed portion is more preferably in the range of 90 to 200 nm/sec, and the permeation rate of the alkaline developing solution into negative recording layer, 80 nF/sec or less.

Any one of the methods commonly practiced in the art may be used for controlling the developing speed of unexposed portion of the negative recording layer and the permeation rate of the alkaline developing solution into cured negative recording layers. For example, it is effective to add a hydrophilic compound for improvement in the developing speed of unexposed portion, and to add a hydrophobic compound for suppressing penetration of the developing solution into exposed portion.

In the invention, adjustment of the content of each component contained in the negative recording layer according to the invention (component in the photosensitive composition according to the invention) allows easier control of the developing speed of negative recording layer and the permeation rate of developing solution in the preferable range. In addition, the negative recording layer according to the invention preferably has physical properties in the ranges described above.

[Substrate]

Any one of the publicly known hydrophilic substrates used for planographic printing plate precursors may be used as the substrate for the planographic printing plate precursors according to the invention.

The substrates to be used are preferably plate-shaped materials higher in dimensional stability. Examples thereof include papers, papers laminated with a plastic resin (e.g., polyethylene, polypropylene, polystyrene, and the like); metal plates (e.g., aluminum, zinc, copper, and the like); plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinylacetal, and the like); papers or plastic films laminated or deposited with the above metals; and the like. These surfaces may be further subjected to a suitable physical or chemical treatment known in the art if necessary, for improvement in hydrophilicity, strength, and the like.

Preferable substrates include papers, polyester films, or aluminium plates. Among them, aluminium plates, which are superior in dimensional stability and relatively cheaper and provide surfaces superior in hydrophilicity and strength if necessary by a surface treatment, are more preferable. In addition, composite sheets such as those disclosed in JP-B No. 48-18327, wherein an aluminum sheet is laminated on a polyethylene terephthalate film, are also preferable.

The aluminum plates are metal plates higher in dimensional stability containing aluminum as the main component, and examples thereof include pure aluminium plates, alloy plates containing aluminum as the main component as well as trace amounts of foreign elements, and plastic films or papers whereon aluminum (alloy) is laminated or deposited. In the description below, aluminum substrates generally mean substrates made of aluminum or an aluminum alloy above. The foreign elements contained in the aluminum alloy include silicon, iron, manganese, copper, magnesium, chromium, zinc, bismuth, nickel, titanium, and the like, and the content of the foreign elements in alloys is 10% by mass or less. Although the most preferable aluminium in the invention is pure aluminium, the aluminum plate may contain a small amount of foreign elements, as it is difficult to prepare completely pure aluminium due to the problems in refining processes. As described above, the components of the aluminium plates to be used in the invention may not be particularly specified, and any one of the aluminium plates known and used in the art, for example, JIS A1050, A1100, A3103, and A3005, may be used arbitrarily.

The thickness of the aluminum substrate used in the invention may be suitably adjusted according to the sizes of printing machine and printing plate and the user needs. The thickness is preferably 0.25 to 0.55 mm, more preferably 0.3 to 0.50 mm, from the viewpoints of handling and prevention of the jamming in a CTP exposure apparatus.

In addition, the aluminum substrates suitable for the invention preferably have the following surface profile.

<Surface Profile of Aluminum Substrate>

The aluminum substrate according to the invention preferably has the factors of surface profile, Ra, ΔS, and a45, respectively satisfying the following conditions (i) to (iii).

(i) Ra: 0.2 to 0.40 μm (ii) ΔS: 35 to 85%

(iii) a45: 25 to 55%

Here, "Ra" represents a surface roughness.

"ΔS" is a value calculated from an actual area $S_x$ obtained by approximate three-point method and a geometrically determined area $S_0$ according to the following formula.

$$\Delta S(\%)=(S_x-S_0)/S_0\times 100$$

"a45" represents the areal rate of the portions having an inclination angle 45° or more, obtained by extracting the component having a wavelength of 0.2 to 2 μm.

Hereinafter, these factors of surface profile will be described in detail.

Ra represents a surface roughness. The surface roughness (Ra) of an aluminum substrate is an average roughness (arithmetic average roughness) on the centerline thereof in the direction orthogonal to the rolling direction of the aluminum substrate. When a portion of L in length in the center line direction is cut off from the roughness curve determined by a profilometer and the roughness curve is expressed by an equation Y=f(X) by plotting the center line of the cut portion in X axis and the corresponding roughness in the Y axis, Ra represents a value (μm) obtained by the following formula: (L and the average roughness are determined according to JIS B0601.)

$$Ra=\frac{1}{L}\int_0^L |f(X)|dX$$

In principle, a greater surface roughness is effective in increasing the water-holding property of the surface. However, a greater surface roughness is often accompanied with local deep dents, which cause improper development, leading to local afterimages, and thus Ra is preferably in the following range.

That is, in the invention, Ra is preferably in the range of 0.20 to 0.40 μm, more preferably in the range of 0.20 to 0.35 μm, and still more preferably in the range of 0.25 to 0.35 μm.

ΔS is calculated from an actual area $S_x$, which is determined by approximate three-point method from three-dimensional data obtained by measuring a 50×50-μm substrate surface at 512×512 points by using the atomic force microscope described below, and a geometrically determined area (apparent area) $S_0$ according to the following formula.

$$\Delta S(\%)=(S_x\times S_0)/S_0\times 100$$

The surface area ratio ΔS is a factor indicating the amount of increase in actual area $S_x$ by a surface roughening treatment relative to the geometrically determined area $S_0$.

Increase in ΔS leads to expansion of the contact area to the negative recording layer, consequently to improvement in printing durability. Accordingly, ΔS is preferably in the following range.

Namely, in the invention, ΔS is preferably in the range of 35 to 85%, more preferably in the range of 40 to 85%, and still more preferably in the range of 40 to 80%.

As will be described in detail below, a45 represents an areal rate of the area having an inclination angle 45° or more (steepness) as determined by extracting the components having a wavelength of 0.2 μm to 2 μm from the three-dimensional data obtained by measuring 512×512 points in an area of 50 μm×50 μm of the substrate surface by using an atomic force microscope.

The steepness is a factor indicating the steepness of the prongs on the substrate surface. More specifically, a45 is a relative rate of the area having an inclination having a certain angle or more, with respect to the actual area of the substrate surface.

For improvement in adhesiveness between the negative recording layer and the substrate and thus in printing durability, the rate of the area having an inclination angle of 45° or more (steepness), a45, is preferably higher. On the other hand, the rate of the area having an inclination angle of 45° or more (steepness), a45, is desirably smaller for suppressing inking on non-image portions and improving smut resistance. Accordingly, a45 is preferably in the following range.

Namely, in the invention, a45 is preferably in the range of 25 to 55%, more preferably in the range of 30 to 55%, and still more preferably in the range of 30 to 50%.

ΔS and a45 of the aluminum substrates according to the invention are determined by the following methods.

(1) Determination of Surface Profiles by Atomic Force Microscope

Three-dimensional data about the surface profile are first obtained by using an atomic force microscope (AFM) for determination of ΔS and a45 in the invention.

The measurements are performed, for example, under the following condition. An aluminum substrate previously cut into a square piece of 1 cm in length is placed on the horizontal stage of a piezoscanner, and when the cantilever is brought closer enough to the surface of the sample that atomic force works between them, the irregularity of the sample surface in the Z direction is detected as piezoelectricity while the probe is scanned in the X and Y directions. Used is a piezoscanner whereof the probe is movable in the range of 150 μm in the X and Y directions and in a range of 10 μm in the Z direction. Measurements are performed in the dynamic force mode (DFM) by using a cantilever having a resonance frequency of 120 to 150 kHz and a spring constant of 12 to 20 N/m (trade name: SI-DF20, manufactured by NANOPROBE). The slight inclination of the sample was corrected by processing the three-dimensional data thus obtained by least-square approximation, giving the reference plane.

Measurements are made at a total of 512×512 sites in a surface area of 50 μm×50 μm in size. The resolution in the X and Y directions is 1.9 μm, and that in the Z direction is 1 nm; and the scanning speed is 60 μm/sec.

(2) Correction of Three-Dimensional Data

The three-dimensional data obtained in (1) are used per se for calculation of ΔS. However, for calculation of a45, the three-dimensional data obtained in (1) from which components having a wavelength of 0.2 to 2 μm are removed for correction are used. This correction can remove the noises generated by the contact of the probe with the edge portions of projections and of other portion of the probe with the wall surface of deep dents when a substrate having large irregularity such as the substrate for a planographic printing plate precursor is scanned with the AFM probe.

The correction is made by high-speed Fourier transformation of the three-dimensional data obtained in (1) to give frequency distribution, removal of the components having a wavelength 0.2 μm or more and 2 μm or less, and subsequent inverse Fourier transformation of the resulting data.

(3) Calculation of Each Factor

Calculation of ΔS

Actual area $S_x$ is determined by extracting neighboring three points by using the three-dimensional data [f(x, y)] obtained in (1) and summing up the areas of the microtriangles formed by these three points. The surface area ratio ΔS can be calculated from the actual area $S_x$ thus obtained and geometrically determined area $S_0$, according to the following formula. Herein, $S_0$ represents a geometrically determined area, calculated by the formula, $S_0=L_x \times L_y$, wherein $L_x$ and $L_y$ each are 50 μm in the invention.

$$\Delta S(\%)=(S_x-S_0)/S_0\times 100$$

Calculation of a45

An inclination angle distribution curve was prepared by extracting neighboring three points by using the three-dimensional data [f(x, y)] obtained after correction in (2) and determining the angles between the plane of all the micro-triangles formed by these three points and the reference plane. On the other hand, the actual area is calculated by summing up the areas of all microtriangles. The ratio of the area having an inclination angle of 45° or more with respect to the actual area, a45, is calculated form the inclination angle distribution curve.

In the invention, aluminum substrates having the surface profile described above can be prepared by the surface treatment described below.

Hereinafter, the surface treatment provided for the aluminum substrates will be described.

(Surface Roughening Treatment)

Methods for surface roughening treatment include mechanical surface roughening, chemical etching, and electrolytic graining methods disclosed in JP-A No. 56-28893. The methods further include electrochemical surface roughening wherein the surfaces are roughened electrochemically in a hydrochloric acid or nitric acid electrolyte; and mechanical surface roughening including wire brush graining wherein the aluminum surfaces are scratched with metal wires, ball graining wherein the aluminum surfaces are scratched with abrasive balls and other abrasives, and brush graining wherein the surfaces are roughened with nylon brushes and abrasives. These surface-roughening methods may be used alone or in combination.

Among them, the method most effective for such surface roughening is the electrochemical method wherein the surfaces are roughened chemically in a hydrochloric or nitric acid electrolyte. In such a case, suitable amount of electricity applied to the anode is in the range of 50 to 400 C/dm$^2$. Specifically, the surfaces are preferably subjected at least to an alternate- or direct-current electrolysis in an electrolytes containing 0.1 to 50% hydrochloric acid or nitric acid, under the condition of a temperature of 20 to 80° C., a period of 1 second to 30 minutes, and an electric current density of 10 to 50 A/dm$^2$.

The aluminum substrate after the surface roughening treatment may be further chemically etched with an acid or alkali. Preferable examples of the etching agents include sodium hydroxide, sodium carbonate, sodium aluminate, sodium metasilicate, sodium phosphate, potassium hydroxide, lithium hydroxide, and the like, and the preferable ranges of concentration and temperature are respectively 1 to 50% and 20 to 100° C. After etching, the surfaces are washed with an acid for removal of the smuts remaining thereon. Acids frequently used include nitric acid, sulfuric acid, phosphoric acid, chromic acid, hydrofluoric acid, borofluoric acid, and the like.

In particular, preferable methods for removal of the smuts after electrochemical surface roughening treatment include the method described in JP-A No. 53-12739 wherein the surface is brought into contact with 15 to 65% by mass sulfuric acid at a temperature of 50 to 90° C., and the method described in JP-B No. 48-28123 wherein the surface is alkaline etched.

The methods and conditions are not particularly limited to the examples described above, if the factors of the surface profile, Ra, ΔS, and a45, satisfy the conditions (i) to (iii) after treatment.

(Anodizing Process)

Aluminum substrates whereon an oxide layer is formed in the above manner are subjected to an anodizing treatment.

In the anodizing treatment, aqueous solution of sulfuric acid, phosphoric acid, oxalic acid, and boric acid/sodium borate are used alone or in combination of plural solutions as the main component of the electrolytic solution. The electrolyte solution may of course contain other components commonly found at least in Al alloy plates, electrodes, tap water, underground water, and the like. In addition, the second and third components may be added. The second and third components include, for example, cations including metal ions such as Na, K, Mg, Li, Ca, Ti, Al, V, Cr, Mn, Fe, Co, Ni, Cu, and Zn, and ammonium ion; and anions such as nitrate, carbonate, chloride, phosphate, fluoride, sulfite, titanate, silicate, and borate ions. The concentration is preferably about 0 to 10,000 ppm. The condition for the anodizing treatment is selected in such a manner that the amount of anodic oxide film formed by the treatment is in the range of 0.5 to 10.0 $g/m^2$ and more preferably in the range of 1.0 to 5.0 $g/m^2$. The concentration of the acid commonly used as the main component of the electrolyte is 30 to 500 g/L, and the temperature of the treatment solution is 10 to 70° C. The anodizing treatment is preferably conducted at an electric current density in the range of 1 to 40 $A/m^2$ either by direct- or alternate-current electrolysis.

(Hydrophilizing Treatment)

Any one of the methods commonly practiced in the art may be used for hydrophilization of substrate surfaces. Particularly preferable is a hydrophilizing treatment by using a silicate salt, polyvinyl phosphonic acid, and the like. The film is preferably formed at an amount of 2 to 40 $mg/m^2$, more preferably 4 to 30 $mg/m^2$ as Si or P element. The coating amount can be determined by fluorescent X-ray analysis.

The hydrophilizing treatment above can be carried out, for example, by immersing an aluminum substrate whereon an anodic oxide film is formed in an aqueous solution containing an alkali metal silicate salt or polyvinyl phosphonic acid at a concentration of 1 to 30%, preferably 2 to 15% by mass, and having a pH at 25° C. in the range of 10 to 13 at 15 to 80° C. for 0.5 to 120 seconds.

The alkali metal silicate salts used for the hydrophilizing treatment include sodium silicate, potassium silicate, lithium silicate, and the like. The hydroxides used for raising the pH of the aqueous alkali metal silicate salt solution include sodium hydroxide, potassium hydroxide, lithium hydroxide, and the like. An alkaline earth metal salt or a Group IVB metal salt may be added to the treatment solution. Examples of the alkaline earth metal salts include water-soluble salts such as nitric acid salts such as calcium nitrate, strontium nitrate, magnesium nitrate, and barium nitrate, sulfate salts, hydrochloric acid salts, phosphate salts, acetate salts, oxalate salts, borate salts, and the like. Examples of the Group IVB metal salts include titanium tetrachloride, titanium trichloride, titanium potassium fluoride, titanium potassium oxalate, titanium sulfate, titanium tetraiodide, zirconium oxychloride, zirconium dioxide, zirconium oxychloride, zirconium tetrachloride, and the like.

The alkaline earth metal or Group IVB metal salts may be used alone or in combination of two or more. The preferable content of these metal salts is in the range of 0.01 to 10% and more preferably in the range of 0.05 to 5.0% by mass. Alternatively, the silicate electrodeposition described in U.S. Pat. No. 3,658,662 is also effective.

Further, combination of the substrate previously subjected to an electrolytic graining and the anodizing and hydrophilizing treatments as disclosed in JP-B No. 46-27481, and JP-A Nos. 52-58602 and 52-30503 is also useful as the surface treatment.

[Intermediate Layer (Undercoating Layer)]

The planographic printing plate precursor according to the invention may have additionally an intermediate layer (undercoating layer) for improvement of the adhesiveness between the negative recording layer and the substrate and preventing smuts. Specific examples of these intermediate layers include those described in JP-B No. 50-7481; JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260535, 10-282682, and 11-84674; Japanese Patent Application Nos. 8-225335, 8-270098, 9-195863, 9-195864, 9-89646, 9-106068, 9-183834, 9-264311, 9-127232, 9-245419, 10-127602, 10-170202, 11-36377, 11-165861, 11-284091, and 2000-14697; and the like.

[Back Coat Layer]

The planographic printing plate precursor according to the invention may have additionally a back coat layer on the rear face of the substrate if necessary. Coating layers prepared with the organic polymer compounds described in JP-A No. 5-45885 and with the metal oxide obtained by hydrolysis and polycondensation of an organic or inorganic metal compound described in JP-A No. 6-35174 are preferably used as the back coat layer.

Among these coating layers, those containing silicon alkoxide compounds such as $Si(OCH_3)_4$, $Si(OC_2H_5)_4$, $Si(OC_3H_7)_4$, and $Si(OC_4H_9)_4$ are particularly preferable, as the silicon compounds are inexpensive and readily available, and provide metal-oxide coating layers superior in development resistance.

<Plate-Making>

The steps of exposure and development are at least conducted for making the planographic printing plate precursor according to the invention.

A preferable light source used for exposure of the planographic printing plate precursor according to the invention is an infrared laser. Alternatively, it is also possible to use an ultraviolet lamp or a thermal head for thermal recording.

Among them, preferable light source in the invention is an infrared light-emitting solid state or semiconductor laser, which emits a light having a wavelength of 750 nm to 1,400 nm. The output of the laser is preferably 100 mW or more. A multi-beam laser device is preferably employed for shortening the exposure time. The exposure time per image pixel is preferably 20 μsec or less. The energy of laser irradiated onto the planographic printing plate precursor is preferably 10 to 300 $mJ/cm^2$. If the exposure energy is too low, the negative recording layer may not be cured sufficiently. On the contrary, if the exposure energy is too high, images formed on the negative recording layer may be damaged by laser abrasion.

Multiple light beams from a light source may be irradiated overlapped in the exposure step according to the invention. The overlapping irradiation means that the sub-scanning pitch width is less than the beam width. When the beam width is expressed by a half-value width of beam intensity (FWHM), the overlap can be expressed quantitatively, for example, by an overlapping coefficient, i.e., FWHM/sub-scanning pitch width. The overlapping coefficient is preferably 0.1 or more in the invention.

Methods of scanning the light from light source of the exposure apparatus used in the invention are not particularly restricted. The exposure may be carried out either by scanning the external or internal wall of cylindrical printing plate precursors, or the surface of flat printing plate precursors. The light source may be single channeled or multi-channeled. The multi-channel light sources are preferably used for scanning the external surface of cylindrical printing plate precursors.

The planographic printing plate precursor according to the invention is developed after exposure. The developing solution used for development is preferably an aqueous alkaline solution at a pH of 14 or less and more preferably an aqueous alkaline solution containing an anionic surfactant at a pH of 8 to 12. Examples thereof include inorganic alkaline solutions containing sodium tertiary phosphate, potassium tertiary phosphate, and ammonium tertiary phosphate; sodium secondary phosphate, potassium secondary phosphate, and ammonium secondary phosphate; sodium carbonate, potassium carbonate, and ammonium carbonate; sodium bicarbonate, potassium bicarbonate, and ammonium bicarbonate; sodium borate, potassium borate, and ammonium borate; sodium hydroxide, ammonium hydroxide, potassium hydroxide and lithium hydroxide; and the like. The examples also include organic alkaline solutions containing monomethyamine, dimethyamine, trimethyamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and the like. These alkaline solutions may be used alone or in combination of two or more.

For development of planographic printing plate precursors according to the invention, an anionic surfactant is added to the developing solution in an amount of 1 to 20% by mass. The amount is more preferably 3 to 10% by mass. A too smaller amount leads to decrease in developability, while an excessively larger amount to adverse effects of deterioration in mechanical strengths such as the abrasion resistance of images. Examples of the anionic surfactants include sodium salt of lauryl alcohol sulfate; ammonium salt of lauryl alcohol sulfate; sodium salt of octyl alcohol sulfate; alkylarylsulfonic acid salts such as sodium salt of isopropylnaphthalenesulfonic acid, sodium salt of isobutylnaphthalenesulfonic acid, sodium salt of polyoxyethylene glycol mononaphthylether sulfuric acid ester, sodium salt of dodecylbenzenesulfonic acid, and sodium salt of m-nitrobenzenesulfonic acid; higher alcohol sulfuric acid esters having 8 to 22 carbons such as sodium alkyl sulfate; aliphatic alcohol phosphoric acid ester salts such as sodium salt of cetyl alcohol phosphoric acid ester; alkylamidosulfonic acid salts such as $C_{17}H_{33}CON(CH_3)CH_2CH_2SO_3Na$; bibasic aliphatic ester sulfonic acid salts such as sodium sulfosuccinic acid dioctylester and sodium sulfosuccinic acid dihexylester; and the like.

In addition, an organic solvent miscible with water such as benzyl alcohol may be added to the developing solution if necessary. The organic solvent is selected from those having a solubility in water of about 10% by mass or less, and more preferably 5% by mass or less. Specific examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, 3-methylcyclohexanol, and the like. The content of the organic solvents is preferably 1 to 5% by mass, with respect to the total amount of developing solution used. The amount is closely related to the amount of surfactant used, and it is preferable to increase the amount of anionic surfactant in line with the amount of organic solvent. It is because if an organic solvent is added in a greater amount while the amount of an anionic surfactant is kept small, the organic solvent may not be solubilized and thus may not allow the preferable developability expected.

Further, another additive such as an antifoamer or a water softener may be added if necessary. Examples of the water softeners include polyphosphate salts such as $Na_4P_2O_7$, $Na_5P_3O_{10}$, $Na_3P_3O_9$, $Na_2O_4P(NaO_3P)PO_3Na_2$, and Calgon (sodium polymetaphosphate); aminopolycarboxylic acids (e.g., ethylenediamine tetraacetic acid, the potassium and sodium salts thereof; diethylenetriamine pentaacetic acid, the potassium and sodium salts thereof; triethylenetetramine hexaacetic acid, the potassium and sodium salts thereof; hydroxyethylethylenediamine triacetic acid, the potassium and sodium salts thereof; nitrilotriacetic acid, the potassium and sodium salts thereof; 1,2-diaminocyclohexane tetraacetic acid, the potassium and sodium salts thereof; 1,3-diamino-2-propanol tetraacetic acid, the potassium and sodium salts thereof); other polycarboxylic acids (e.g., 2-phosphonobutanetricarboxylic acid-1,2,4, the potassium and sodium salts thereof; 2-phosphonobutanonetricarboxylic acid-2,3,4, the potassium and sodium salts thereof, and the like); and organic phosphonic acids (e.g., 1-phosphonoethanetricarboxylic acid-1,2,2, the potassium and sodium salts thereof; 1-hydroxyethane-1,1-diphosphonic acid, the potassium and sodium salts thereof; aminotrimethylenephosphonic acid, the potassium and sodium salts thereof, and the like). The optimal amount of the water softeners used varies according to the hardness and amount of hard water used, but is commonly in the range of 0.01 to 5%, more preferably 0.01 to 0.5% by mass in the developing solution used.

When planographic printing plate precursors are developed in an automatic developing machine, the developing solution gradually deteriorates in parallel with the processing amount. Such a deteriorated developing solution may be refreshed by using a replenishing solution or a fresh developing solution. In such a case, it is preferable to replenish the developing solution according to the method described in U.S. Pat. No. 4,882,246. Further, the developing solutions described in JP-A Nos. 50-26601 and 58-54341 and JP-B Nos. 56-39464, 56-42860, and 57-7427 are also effective.

The planographic printing plate precursors developed in this manner may be further treated with washing water, a rinsing solution containing a surfactant and the like, or a desensitizing solution containing a gum arabic, starch derivative, and the like as described in JP-A Nos. 54-8002, 55-115045, and 59-58431, and the like. The planographic printing plate precursors according to the invention may be subjected to a combination of these treatments.

During the plate-making of the planographic printing plate precursors according to the invention, it is effective to heat or irradiate light onto the entire portions of images after development for improvement in the strength of image portions and thus in printing durability thereof.

The heating after development may be carried out under a severe condition, but is usually at a heating temperature in the range of 200 to 500° C., from the viewpoints of obtaining a superior image portion strengthening effect and suppressing damages of the substrate and the image portions thereof by heat.

The planographic printing plates obtained by the above treatments are sent to an offset printing machine, wherein they are used for printing on a great many number of papers.

Stains or smuts on the planographic printing plate used for printing may be removed by use of a plate cleaner. Any one of the plate cleaners for PS plates known in the art may be used as the plate cleaner for dirt removal on printing plates during printing. The plate cleaners include CL-1, CL-2, CP, CN-4, CN, CG-1, PC-1, SR, IC (manufactured by Fuji Photo Film Co., Ltd.), and the like.

EXAMPLE

Hereinafter, the present invention will be described with reference to the following Examples, but it should be understood that the scope of the present invention is not limited to these Examples.

First, method for preparing the compounds typical of the polymers having a phenyl group substituted with a vinyl group on the side chain (particular polymers) and the monomers having two or more phenyl groups substituted with a vinyl group (particular monomers) will be described below.

Preparative Example 1

Particular Polymer (P-1)

To a suspension of 150 g of bismuthiol (2,5-dimercapto-1,3,4-thiadiazole) in 600 ml of methanol, 101 g of triethylamine was added gradually while cooled, to give a homogeneous solution. After dropwise addition of p-chloromethylstyrene (trade name: CMS-14, manufactured by Seimi Chemical) over 10 minutes at room temperature, the solution was stirred additionally for 3 hours, allowing the reaction product to precipitate gradually. After stirring, the solution was cooled in an ice bath until the internal temperature reaches 10° C. and filtered under reduced pressure to separate the precipitate. The precipitate was washed with methanol and dried in a vacuum dryer for a day and night, to give the following compound (monomer) at a yield of 75%.

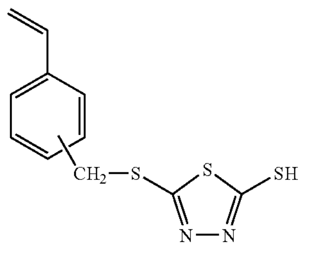

To a 1-liter four-neck flask equipped with a stirrer, nitrogen inlet, thermometer, and reflux condenser containing 40 g of the monomer, 70 g of methacrylic acid, 200 ml of ethanol, and 50 ml of distilled water were added. Additionally, to the solution cooled in an ice bath, 110 g of triethylamine was added while stirring. The solution was heated under a nitrogen atmosphere until the internal temperature reaches 70° C. Polymerization was initiated by addition of 1 g of azobisisobutyronitrile (AIBN) at the temperature. After 6 hours of heating and stirring, the polymer solution was cooled to room temperature. Part of the solution was withdrawn and adjusted to a pH of about 3 by addition of a dilute hydrochloric acid. A polymer having the following structure was obtained by pouring the above solution into water.

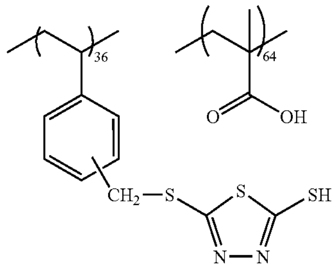

To the other part of the polymer solution, 100 g of 1,4-dioxane and 23 g of p-chloromethylstyrene were added, and the resulting solution was stirred at room temperature additionally for 15 hours. Subsequently, 80 to 90 g of conc. hydrochloric acid (35 to 37% aqueous solution) was added to the solution. After confirming that the pH of the solution is 4 or less, the solution was poured into 3 liters of distilled water. Resulting polymer precipitate was separated by filtration, washed several times with distilled water, and dried in a vacuum dryer for a day and night. In this manner, the desirable particular polymer (P-1) was obtained at a yield of 90%. Molecular-weight measurement by gel-permeation chromatography revealed that the polymer has a weight average molecular weight of 90,000 (as polystyrene). In addition, analysis by proton NMR indicated that the polymer indeed has the structure of particular polymer (P-1).

Preparative Example 2

Particular Monomer (C-5)

To a suspension of 89 g of thiocyanuric acid in 1.5 liters of methanol, a 30% aqueous solution containing 84 g of potassium hydroxide was gradually added under cooling, to give a homogeneous solution. To the solution, 230 g of p-chloromethylstyrene was added at room temperature gradually so that the internal temperature does not exceed 40° C. Although the product precipitates soon after the addition, the stirring was continued additionally for 3 hours. Then, the product was separated by filtration under reduced pressure. The product was washed with methanol and dried in a vacuum dryer for a day and night, to give the particular monomer (C-5) at a yield of 90%.

Examples 1 to 7

[Preparation of Substrate]

An aluminum plate according to JIS A1050 of 0.30 mm in thickness and 1,030 mm in width was subjected to the following surface treatment.

<Surface Treatment>

The surface treatment was carried out sequentially in the following treatment steps (a) to (f). The liquid remaining on the aluminum plate after each treatment or water washing was removed with a nip roller.

(a) An aluminum plate was etched in a solution containing sodium hydroxide at a concentration 26% by mass and aluminium ion at a concentration of 6.5% by mass at a temperature of 70° C., until aluminum was dissolved to an amount of 5 g/m$^2$. The etched plate was then washed with water.

(b) The aluminum plate was subjected to a desmut treatment of spraying an aqueous 1% by mass nitric acid solution (containing aluminium ion at 0.5% by mass) at a temperature of 30° C., and then washed with water.

(c) The aluminum plate was then subjected to an electrochemical surface roughening treatment by applying a 60-Hz alternate current voltage continuously. The electrolyte used for the treatment was an aqueous 1% by mass nitric acid solution (containing 0.5% by mass of aluminium ion and 0.007% by mass of ammonium ion) at a temperature of 30° C. The electrochemical surface roughening treatment was conducted by using an alternate-current power source having a time required for the electric current to increase from zero to peak (TP) of 2 msec, a duty ratio of 1:1, and a trapezoidal waveform; and a carbon electrode as the reference electrode. A ferrite electrode was used as the auxiliary anode. The electric current density was 25 A/dm$^2$ at the peak of electric current. The total amount of electricity used for this treatment was 250 C/cm$^2$ when the aluminium plate was an anode. Part (5%) of the electricity from the power source was applied to the auxiliary electrode. The aluminum plate was then washed with water.

(d) The aluminum plate was etched by spraying a solution containing sodium hydroxide at a concentration 26% by mass and aluminium ion at a concentration of 6.5% by mass at 35° C., until aluminum was dissolved to an amount of 0.2 g/m$^2$. Subsequently, the smuts mainly consisting of aluminum hydroxide generated during the electrochemical surface roughening by using the alternate current above were removed. Next, the edge portions of the pits generated were dissolved and smoothened. The aluminum plate was then washed with water.

(e) The aluminum plate was subjected to a desmut treatment of spraying an aqueous 25% by mass sulfuric acid solution (containing aluminium ion at a concentration 0.5% by mass) at a temperature of 60° C. The aluminum plate was then washed with water by spraying.

(f) The aluminum plate was subjected to an anodizing treatment in an electrolyte containing sulfuric acid at a concentration 170 g/L (additionally containing aluminium ion at a concentration 0.5% by mass) at a temperature of 33° C. at an electric current density of 5 (A/dm$^2$) for 50 seconds. The aluminum plate was then washed with water. After the treatment, the amount of anodic oxide film was 2.7 g/m$^2$.

The surface roughness Ra, surface area ratio ΔS, and steepness a45 of the aluminum substrate thus obtained were respectively 0.27 (measuring apparatus: Surfcom, manufactured by Tokyo Seimitsu Co., Ltd., diameter of the probe tip: 2 μm), 75%, and 44% (measuring apparatus: SPA300/SPI3800N, manufacture by Seiko Instruments Inc.).

[Preparation of Negative Recording Layers]

Subsequently, the following recording layer-coating solution was prepared. The recording layer-coating solution was applied onto the aluminum substrate above after the surface treatment in the amount that the thickness of the film formed becomes 1.4 μm after drying. The coated substrate was dried in a drier at 70° C. for 5 minutes, to give planographic printing plate precursors, [CTP-1] to [CTP-7].

| <Recording layer coating solution> | |
|---|---|
| Radical generator (BC-6) | 2.0 parts by mass |
| Radical generator (T-4) | 2.0 parts by mass |
| Particular polymer (P-1) | 10.0 parts by mass |
| Particular monomer (C-5) | 3.5 parts by mass |
| Infrared absorbent (S-4) | 0.5 part by mass |
| Particular carboxylic acid compound (the kind and content thereof as indicated in Table 1) | |
| Ethyl violet chloride salt | 0.3 part by mass |
| Dioxane | 70.0 parts by mass |
| Cyclohexane | 20.0 parts by mass |

The radical generators, particular polymer, particular monomer, infrared absorbing agent, and particular carboxylic acid compound used in the recording layer-coating solution above each are respectively one of the specific examples described above.

Comparative Example 1

A planographic printing plate precursor [CTP-8] of Comparative Example 1 was prepared in the similar manner to Examples 1 to 7, except that the particular carboxylic acid compounds contained in the recording layer-coating solution of Examples 1 to 7 were not used.

[Evaluation]

(1. Sensitivity (Photosensitive))

Each of the planographic printing plate precursors [CTP-1] to [CTP-8] thus obtained in Examples and a Comparative Example was evaluated according to the following methods.

The planographic printing plate precursor was exposed to 50% screen tint images at a resolution of 175 lpi by using the Trendsetter 3244VX manufactured by Creo having a built-in water-cooled 40 W infrared ray semiconductor laser, under the condition of a rotational frequency of the external drum of 150 rpm and outputs increasing at an log E interval of 0.15 in the range of 0 to 8 W. The exposure was conducted under a condition of 25° C. and 50% RH.

After exposure, the plate was developed in a developing solution containing sodium metasilicate at a concentration of 6% by mass at 30° C. for 10 seconds. The minimum exposure energy required for the screen tint images on the planographic printing plate obtained after development to show 50% was determined as the sensitivity of the planographic printing plate precursor. The evaluation results are summarized in Table 1.

(2. Developability)

The developability of each of the planographic printing plate precursors [CTP-1] to [CTP-8] of Examples and a Comparative Example was evaluated according to the following method.

The concentration of the non-image portions in the planographic printing plate after development, which was obtained by exposing at the minimum exposure energy, an indicator in the evaluation of sensitivity above, and developing under the same condition as that of the evaluation of sensitivity, was determined by using a Macbeth reflection densitometer RD-918. In addition, the planographic printing plate was exposed and developed similarly, except that the development was conducted at 30° C. for 7 seconds. The concentration of the non-image portions in the planographic printing plate thus obtained was also measured. The difference between the concentrations of these non-image portions after 7 and 10-second development Δfog ($fog_{10sec}$−$fog_{7sec}$) was determined as an indicator of developability. A smaller Δfog value indicates better developability. The evaluation results are summarized in Table 1.

(3. Stability Over Time (Raw Stock Storability))

The stability over time of each of the planographic printing plate precursors [CTP-1] to [CTP-8] of Examples and a Comparative Example was evaluated according to the following method.

A planographic printing plate precursor was equilibrated at 25° C. and 40% RH for 2 hours. After the moisture adjustment, the precursor was lapped with an aluminum Kraft paper and stored at 60° C. for 3 days. Subsequently, the precursor was exposed at the minimum exposure energy, the indicator in evaluation of sensitivity, and developed under the same condition as that in the evaluation of sensitivity. The concentration of the non-image portions on the planographic printing plate thus obtained was determined by using a Macbeth reflection densitometer RD-918. In addition, a planographic printing plate precursor immediately after preparation was exposed and developed similarly, and the concentration of the non-image portions thereon was also determined. The difference in concentration between these non-image portions Δfog was determined as the indicator of the stability over time in this evaluation. A smaller Δfog value indicates better stability over time, and a value of 0.02 or less is the level where there are no practical problems. The evaluation results are summarized in Table 1.

3,000 or less is selected from the group consisting of an aromatic carboxylic acid which may have one or more substituents, and a carboxylic acid connected directly to a heterocyclic ring which may have one or more substituents.

2. A photosensitive composition according to claim 1, wherein the compound having at least one carboxylic acid group and a weight average molecular weight of 3,000 or less is selected from the group consisting of a phthalic acid derivative, trimellitic acid derivative, pyromellitic acid derivative, succinic acid derivative, benzoic acid derivative, and glycine derivative.

3. A photosensitive composition according to claim 1, wherein the weight average molecular weight of the compound having at least one carboxylic acid group and a weight average molecular weight of 3,000 or less is in the range of 60 to 2,000.

4. A photosensitive composition according to claim 1, wherein the content of the compound having at least one carboxylic acid group and a weight average molecular weight of 3,000 or less is 0.5% to 30% by mass with respect to the total solid content contained in the photosensitive composition.

5. A photosensitive composition according to claim 1, wherein the compound that generates a radical by application of light or heat is an organic boron salt or trihaloalkyl-substituted compound.

TABLE 1

| | (E) Particular carboxylic acid compound | | Planographic printing | Sensitivity | Developability | Stability over time |
|---|---|---|---|---|---|---|
| | Compound | Content (part by mass) | plate precursor | (mL/cm$^2$) | Δfog | Δfog |
| Example 1 | No. 5 | 1.0 | [CTP-1] | 100 | 0 | 0 |
| Example 2 | No. 11 | 1.0 | [CTP-2] | 100 | 0 | 0 |
| Example 3 | No. 7 | 1.0 | [CTP-3] | 100 | 0 | 0 |
| Example 4 | No. 8 | 1.0 | [CTP-4] | 100 | 0 | 0 |
| Example 5 | No. 5 | 2.0 | [CTP-5] | 95 | 0 | 0 |
| Example 6 | No. 5 | 0.5 | [CTP-6] | 100 | 0.01 | 0.01 |
| Example 7 | No. 5/No. 8 | 1.0/1.0 | [CTP-7] | 95 | 0 | 0 |
| Comparative Example 1 | None | | [CTP-8] | 100 | 0.04 | 0.05 |

As apparent from Table 1, the planographic printing plate precursors according to the invention of Examples 1 to 7 were superior all in sensitivity, developability, and, stability over time.

In contrast, the planographic printing plate precursor of Comparative Example 1 had a similar sensitivity compared to those of Examples 1 to 7, but were inferior in the developability and stability over time and thus still at the level where there are practical problems.

What is claimed is:

1. A photosensitive composition, comprising:

a compound that generates a radical by application of light or heat, a polymer having a phenyl group substituted with a vinyl group on a side chain, a monomer having two or more phenyl groups substituted with a vinyl group, an infrared absorbing agent, and a compound having at least one carboxylic acid group and a weight average molecular weight of 3,000 or less, wherein the compound having at least one carboxylic acid group and a weight average molecular weight of 6. A photosensitive composition according to claim 1, wherein the compound that generates a radical by application of light or heat is a combination of an organic boron salt and a trihaloalkyl-substituted compound.

7. A photosensitive composition according to claim 1, wherein the polymer having a phenyl group substituted with a vinyl group on the side chain is a polymer having a group represented by the following Formula (2) on a side chain:

Formula (2)

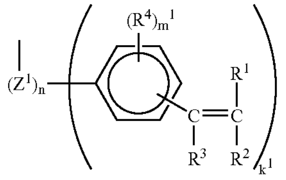

wherein $Z^1$ represents a connecting group; $R^1$, $R^2$, and $R^3$ each independently represent a hydrogen atom, a halogen atom, a carboxy group, a sulfo group, a nitro group, a cyano group, an amido group, an amino group, an alkyl group, an aryl group, an alkoxy group, or an aryloxy group, which may further be substituted with an alkyl group, amino group, aryl group, alkenyl group, carboxy group, sulfo group, or hydroxy group; $R^4$ represents a substituting group or atom; n is 0 or 1; $m^1$ represents an integer of 0 to 4; and $k^1$ represents an integer of 1 to 4.

8. A photosensitive composition according to claim 1, wherein the monomer having two or more phenyl groups substituted with a vinyl group is a compound represented by the following Formula (3):

Formula (3)

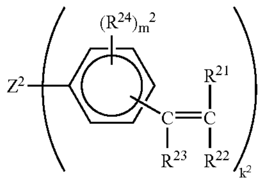

wherein $Z^2$ represents a connecting group; $R^{21}$, $R^{22}$ and $R^{23}$ each independently represent a hydrogen atom, a halogen atom, a carboxy group, a sulfo group, a nitro group, a cyano group, an amido group, an amino group, an alkyl group, an aryl group, an alkoxy group, or an aryloxy group, which may be further substituted with an alkyl group, an amino group, an aryl group, an alkenyl group, a carboxy group, a sulfo group, or a hydroxy group; $R^{24}$ represents a substituting group or atom; $m^2$ represents an integer of 0 to 4; and $k^2$ represents an integer of 2 or more.

9. A photosensitive composition according to claim 1, wherein the infrared absorbing agent is a dye or pigment having an absorption maximum at a wavelength of 760 to 1,200 nm.

10. A planographic printing plate precursor, comprising a substrate and a negative recording layer provided on the substrate, wherein the recording layer contains a photosensitive composition according to claim 1.

11. A planographic printing plate precursor according to claim 10, wherein the compound having at least one carboxylic acid group and a weight average molecular weight of 3,000 or less is selected from the group consisting of a phthalic acid derivative, trimellitic acid derivative, pyromellitic acid derivative, succinic acid derivative, benzoic acid derivative, and glycine derivative.

12. A planographic printing plate precursor according to claim 10, wherein the weight average molecular weight of the compound having at least one carboxylic acid group and a weight average molecular weight of 3,000 or less is in the range of 60 to 2,000.

13. A planographic printing plate precursor according to claim 10, wherein the compound that generates a radical by application of light or heat is an organic boron salt or trihaloalkyl-substituted compound.

14. A planographic printing plate precursor according to claim 10, wherein the compound that generates a radical by application of light or heat is a combination of an organic boron salt and a trihaloalkyl-substituted compound.

15. A planographic printing plate precursor according to claim 10, wherein the polymer having a phenyl group substituted with a vinyl group on the side chain is a polymer having a group represented by the following Formula (2) on a side chain:

Formula (2)

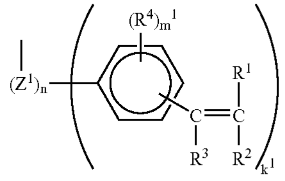

wherein $Z^1$ represents a connecting group; $R^1$, $R^2$, and $R^3$ each independently represent a hydrogen atom, a halogen atom, a carboxy group, a sulfo group, a nitro group, a cyano group, an amido group, an amino group, an alkyl group, an aryl group, an alkoxy group, or an aryloxy group, which may further be substituted with an alkyl group, an amino group, an aryl group, an alkenyl group, a carboxy group, a sulfo group, or a hydroxy group; $R^4$ represents a substituting group or atom; n is 0 or 1; $m^1$ represents an integer of 0 to 4; and $k^1$ represents an integer of 1 to 4.

16. A planographic printing plate precursor according to claim 10, wherein the monomer having two or more phenyl groups substituted with a vinyl group is a compound represented by the following Formula (3):

Formula (3)

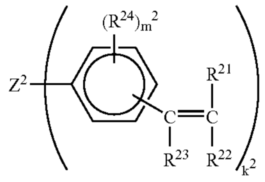

wherein $Z^2$ represents a connecting group; $R^{21}$, $R^{22}$ and $R^{23}$ each independently represent a hydrogen atom, a halogen atom, an carboxy group, a sulfo group, a nitro group, a cyano group, an amido group, an amino group, an alkyl group, an aryl group, an alkoxy group, or an aryloxy group, which may be further substituted with an alkyl group, an amino group, an aryl group, an alkenyl group, a carboxy group, a sulfo group, or a hydroxy group; $R^{24}$ represents a substituting group or atom; $m^2$ represents an integer of 0 to 4; and $k^2$ represents an integer of 2 or more.

17. A planographic printing plate precursor according to claim 10, wherein the infrared absorbing agent is a dye or pigment having an absorption maximum at a wavelength of 760 to 1,200 nm.

18. A planographic printing plate precursor according to claim 10, wherein the substrate is an aluminium plate.

* * * * *